(12) United States Patent
Ishimatsu et al.

(10) Patent No.: US 12,456,691 B2
(45) Date of Patent: Oct. 28, 2025

(54) SEMICONDUCTOR DEVICE

(71) Applicant: ROHM CO., LTD., Kyoto (JP)

(72) Inventors: Yuji Ishimatsu, Kyoto (JP); Kenji Hama, Kyoto (JP); Hideo Hara, Kyoto (JP)

(73) Assignee: ROHM CO., LTD., Kyoto (JP)

( * ) Notice: Subject to any disclaimer, the term of this patent is extended or adjusted under 35 U.S.C. 154(b) by 552 days.

(21) Appl. No.: 17/910,483

(22) PCT Filed: Feb. 22, 2021

(86) PCT No.: PCT/JP2021/006625
§ 371 (c)(1),
(2) Date: Sep. 9, 2022

(87) PCT Pub. No.: WO2021/187018
PCT Pub. Date: Sep. 23, 2021

(65) Prior Publication Data
US 2023/0163078 A1 May 25, 2023

(30) Foreign Application Priority Data
Mar. 19, 2020 (JP) ................................ 2020-048942

(51) Int. Cl.
*H01L 23/538* (2006.01)
*H01L 23/00* (2006.01)
(Continued)

(52) U.S. Cl.
CPC .......... *H01L 23/5386* (2013.01); *H01L 23/15* (2013.01); *H01L 23/3121* (2013.01);
(Continued)

(58) Field of Classification Search
CPC . H01L 23/5386; H01L 23/15; H01L 23/3121; H01L 23/49811; H01L 24/48; H01L 25/18; H01L 2224/48175
See application file for complete search history.

(56) References Cited

U.S. PATENT DOCUMENTS 8,350,369 B2 * 1/2013 Lee .......................... H01L 23/15
257/772
2017/0025331 A1 * 1/2017 Kamiyama ....... H01L 23/49562
2019/0051640 A1 2/2019 Yano et al.

FOREIGN PATENT DOCUMENTS

DE        694 22 463 T2     6/2000
DE   11 2014 001 116 T5    12/2015
(Continued)

OTHER PUBLICATIONS

Office Action issued in corresponding Japanese Patent application No. 2022-508160, Nov. 12, 2024, and machine translation (8 pages).

(Continued)

*Primary Examiner* — Peniel M Gumedzoe
(74) *Attorney, Agent, or Firm* — HSML P.C.

(57) ABSTRACT

A semiconductor device includes a substrate, a conductive section, a sealing resin, and a conductive section wire. The substrate includes a substrate obverse face and a substrate reverse face oriented in opposite directions to each other in a thickness direction. The conductive section is formed of a conductive material and located on the substrate obverse face. The conductive section includes a first section and a second section spaced apart from each other. The sealing resin covers at least a part of the substrate and an entirety of the conductive section. The conductive section wire is conductively bonded to the first section and the second section of the conductive section.

20 Claims, 15 Drawing Sheets

(51) Int. Cl.
  *H01L 23/15*    (2006.01)
  *H01L 23/31*    (2006.01)
  *H01L 23/498*   (2006.01)
  *H01L 25/18*    (2023.01)

(52) U.S. Cl.
  CPC ........ *H01L 23/49811* (2013.01); *H01L 24/48* (2013.01); *H01L 25/18* (2013.01); *H01L 2224/48175* (2013.01)

(56)             References Cited

FOREIGN PATENT DOCUMENTS

| DE | 10 2019 208 826 A1 | 1/2020 |
|----|--------------------|--------|
| JP | 2002-93991 A       | 3/2002 |
| JP | 3133087            | 6/2007 |
| JP | 2020-004893 A      | 1/2020 |
| WO | 2016/194033 A1     | 12/2016 |
| WO | 2019/244372 A1     | 12/2019 |
| WO | 2020/071185 A1     | 4/2020 |

OTHER PUBLICATIONS

Office Action issued in corresponding Japanese Patent application No. 2022-508160, Aug. 27, 2024 and machine translation (8 pages).
International Search Report issued in PCT/JP2021/006625, May 18, 2021 (2 pages).
Office Action issued in corresponding German Patent application No. 11 2021 000 605.3, Sep. 30, 2024 and machine translation (12 pages).

* cited by examiner

SEMICONDUCTOR DEVICE

TECHNICAL FIELD

The present disclosure relates to a semiconductor device.

BACKGROUND ART

Existing semiconductor devices include the one called an intelligent power module (IPM). This type of semiconductor device includes a semiconductor chip, a control chip that controls the semiconductor chip, and a sealing resin covering the semiconductor chip and the control chip (see PTL 1).

PRIOR ART DOCUMENT

Patent Document

Patent Document 1: JP-A-2020-4893

SUMMARY OF THE INVENTION

Problem to be Solved by the Invention

The control chip receives and outputs a plurality of types of control signals. With an increase in the number of control signals, the number of conduction paths to the control chip has to be increased. However, constituting the conduction paths with a plurality of leads, as in conventional devices, may make it difficult to achieve a higher degree of integration of the semiconductor device.

The present disclosure has been accomplished in view of the foregoing situation, and provides a semiconductor device that allows a higher degree of integration to be achieved.

Means to Solve the Problem

According to an aspect of the present disclosure, there is provided a semiconductor device including: a substrate having a substrate obverse face and a substrate reverse face oriented in opposite directions to each other in a thickness direction; a conductive section formed of a conductive material and located on the substrate obverse face; the conductive section including a first section and a second section spaced apart from each other; a sealing resin covering at least a part of the substrate and an entirety of the conductive section; and a conductive section wire conductively bonded to the first section and the second section.

Advantages of the Invention

In the foregoing semiconductor device, the conductive section is formed on the substrate obverse face. Accordingly, conduction paths to electronic parts arranged on the substrate obverse face can be formed utilizing the conductive section provided on the substrate obverse face. Therefore, the conduction paths can be formed of finer lines and in higher density, compared with the case of, for example, using metal leads to constitute the conduction path. In addition, the conductive section wire is conductively bonded to the first section and the second section, spaced apart from each other on the conductive section. Therefore, for example in the case where connection wirings and electronic parts are arranged between the first section and the second section, the conduction path can be shortened, compared with the case of arranging the connection wiring between the first section and the second section through a long detour. Further, a higher degree of freedom can be attained in designing the conduction paths. Consequently, the semiconductor device configured as above allows a higher degree of integration to be achieved.

Other features and advantages of the present disclosure will become more apparent, through detailed description given hereunder with reference to the accompanying drawings.

MODE FOR CARRYING OUT THE INVENTION

Figure 1:
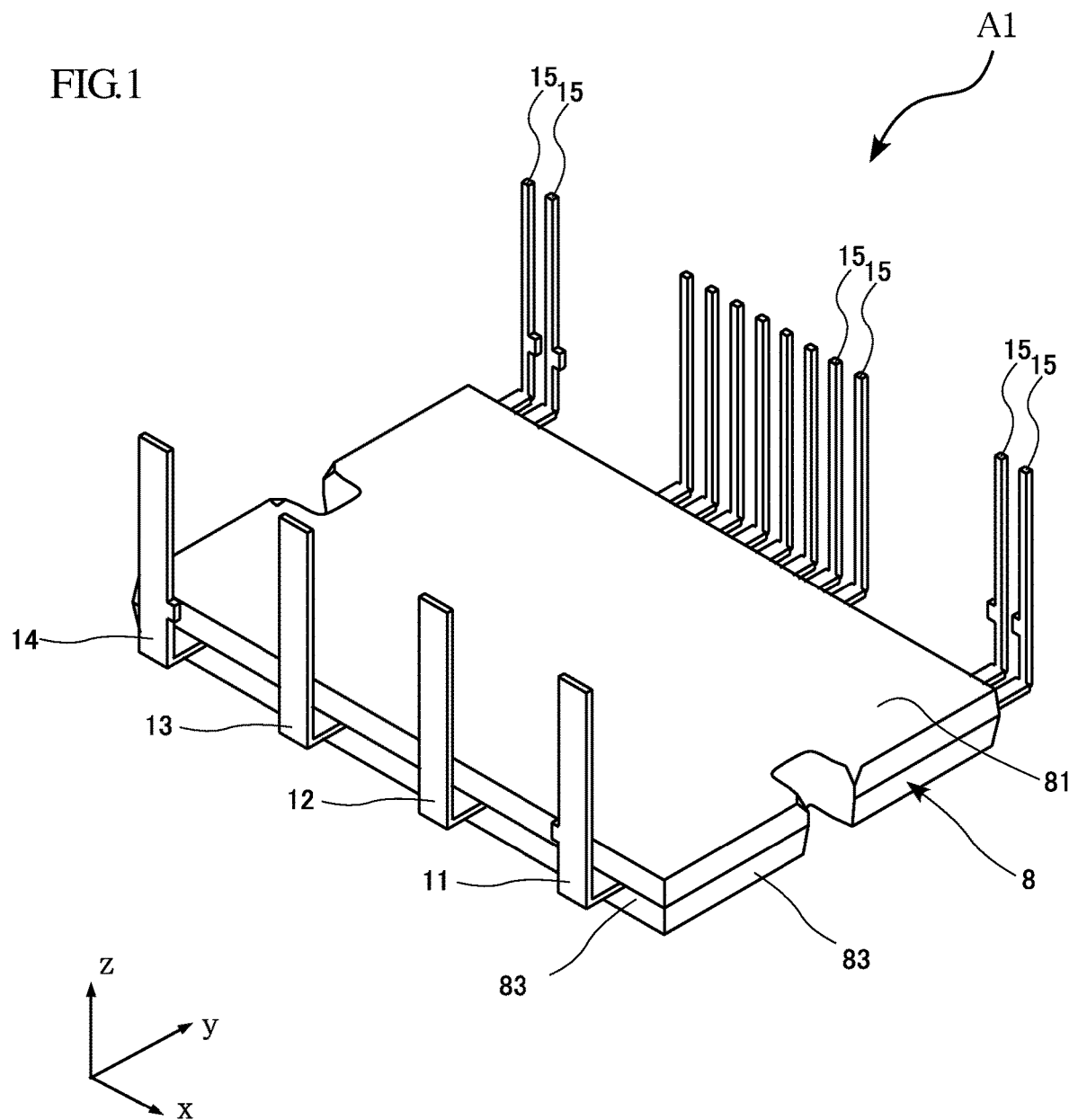
FIG. 1 is a perspective view showing a semiconductor device according to a first embodiment.

Hereafter, exemplary embodiments of the present disclosure will be described in detail, with reference to the drawings.

In the description of the present disclosure, the expression "An object A is formed in an object B", and "An object A is formed on an object B" imply the situation where, unless otherwise specifically noted, "the object A is formed directly in or on the object B", and "the object A is formed in or on the object B, with something else interposed between the object A and the object B". Likewise, the expression "An object A is arranged in an object B", and "An object A is arranged on an object B" imply the situation where, unless otherwise specifically noted, "the object A is arranged directly in or on the object B", and "the object A is arranged in or on the object B, with something else interposed between the object A and the object B". Further, the expression "An object A is located on an object B" implies the situation where, unless otherwise specifically noted, "the object A is located on the object B, in contact with the object B", and "the object A is located on the object B, with something else interposed between the object A and the object B". Further, the expression "An object A overlaps with an object B as viewed in a certain direction" implies the situation where, unless otherwise specifically noted, "the object A overlaps with the entirety of the object B", and "the object A overlaps with a part of the object B".

FIG. 1 to FIG. 8 illustrate a semiconductor device according to a first embodiment. The semiconductor device A1 shown in the mentioned drawings include a plurality of leads 11 to 15 (hereinafter simply "lead 1" where appropriate), a substrate 2, a plurality of bonding sections 25, a conductive section 3, two semiconductor chips 4, two control devices 5, a plurality of passive elements 6, a plurality of wires 71, a plurality of wires 72, wires 73a and 73b, and a sealing resin 8. In this embodiment, the semiconductor device A1 is the intelligent power module (IPM), without limitation thereto. The semiconductor device A1 may be applied, for example, for use in an air-conditioner or a motor control device.

Figure 2:
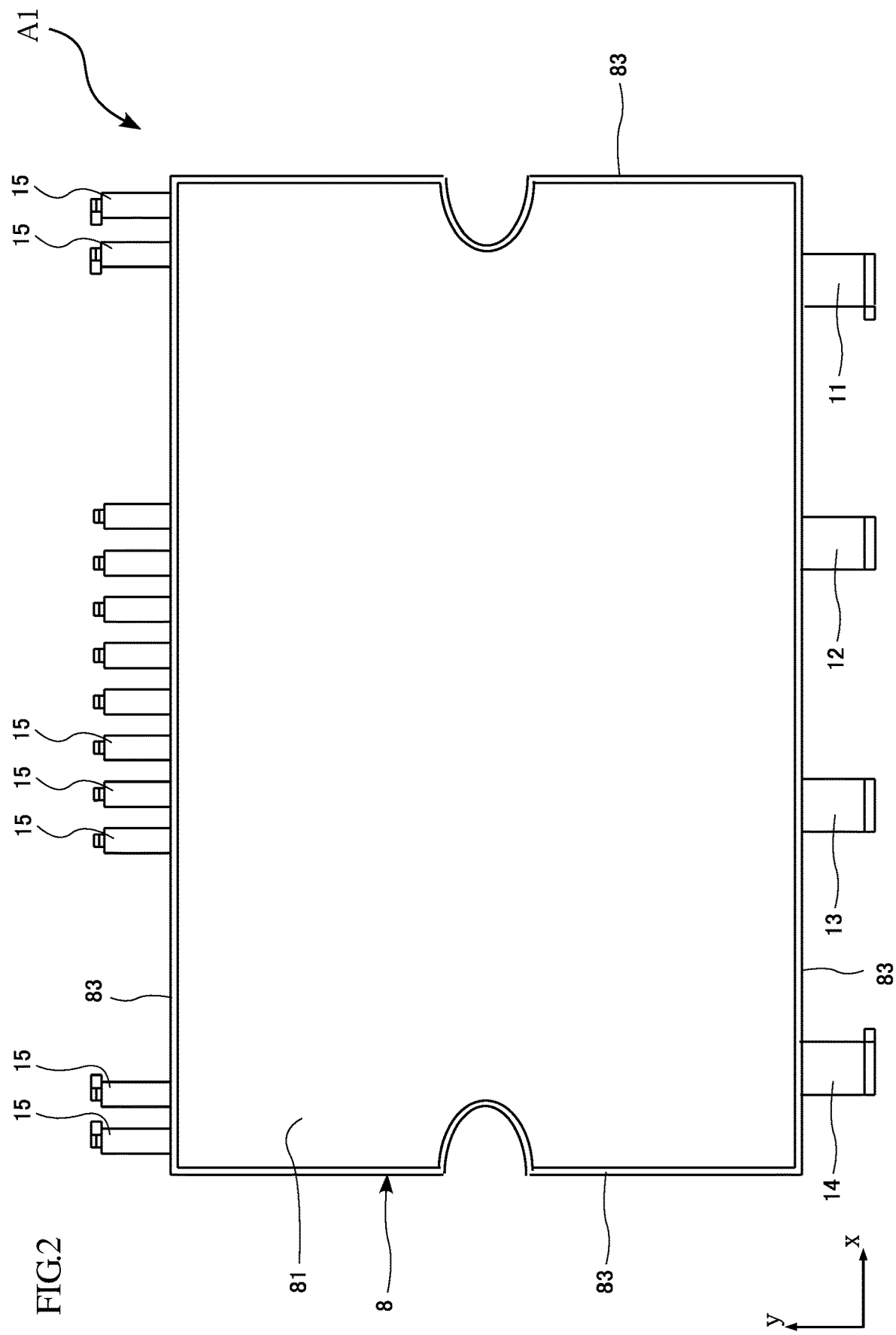
FIG. 2 is a plan view showing the semiconductor device of FIG. 1.
Figure 3:
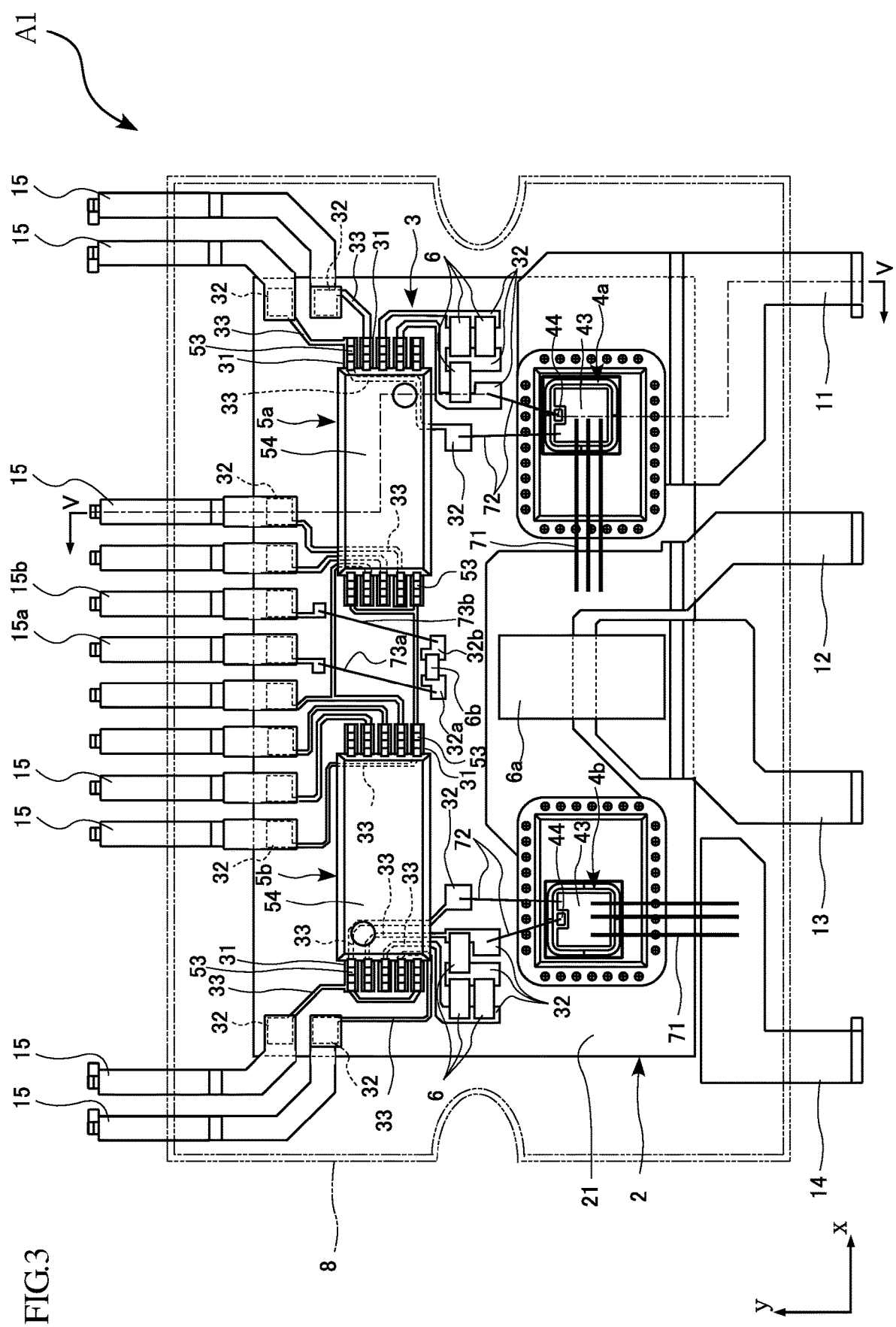
FIG. 3 is a plan view showing the semiconductor device of FIG. 1, seen through a sealing resin.
Figure 4:
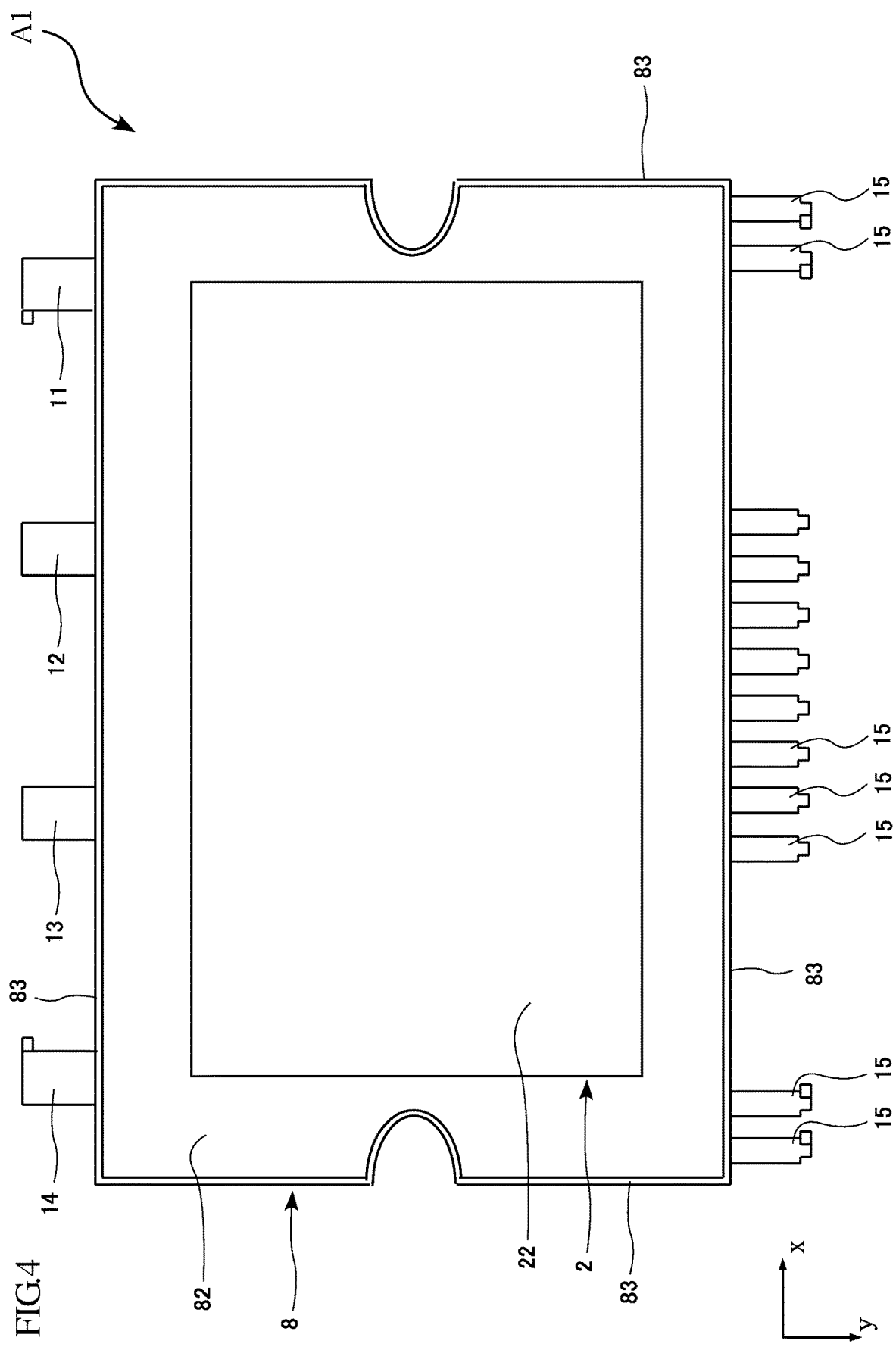
FIG. 4 is a bottom view showing the semiconductor device of FIG. 1.
Figure 5:
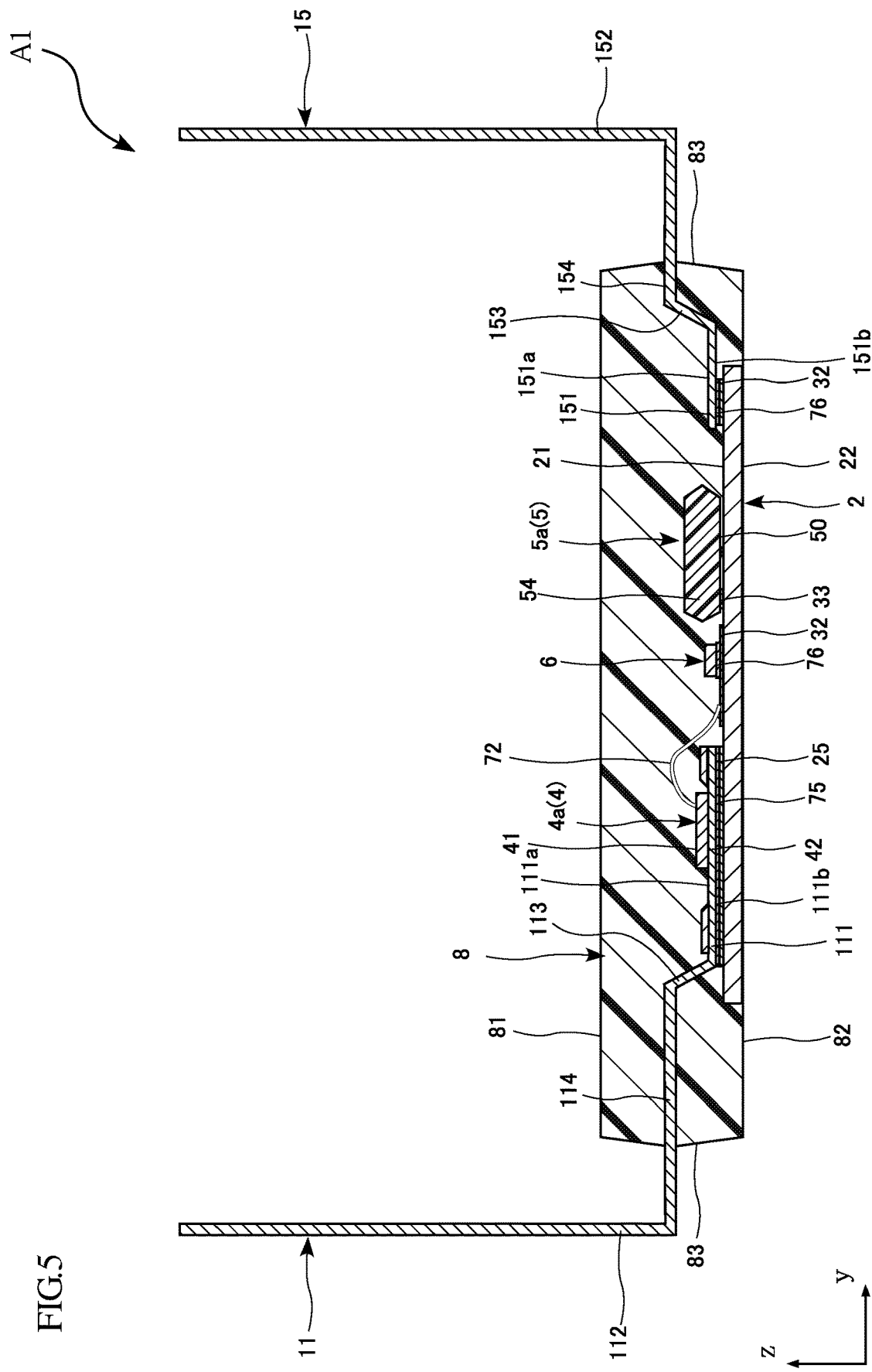
FIG. 5 is a cross-sectional view taken along a line V-V in FIG. 3.
Figure 6:
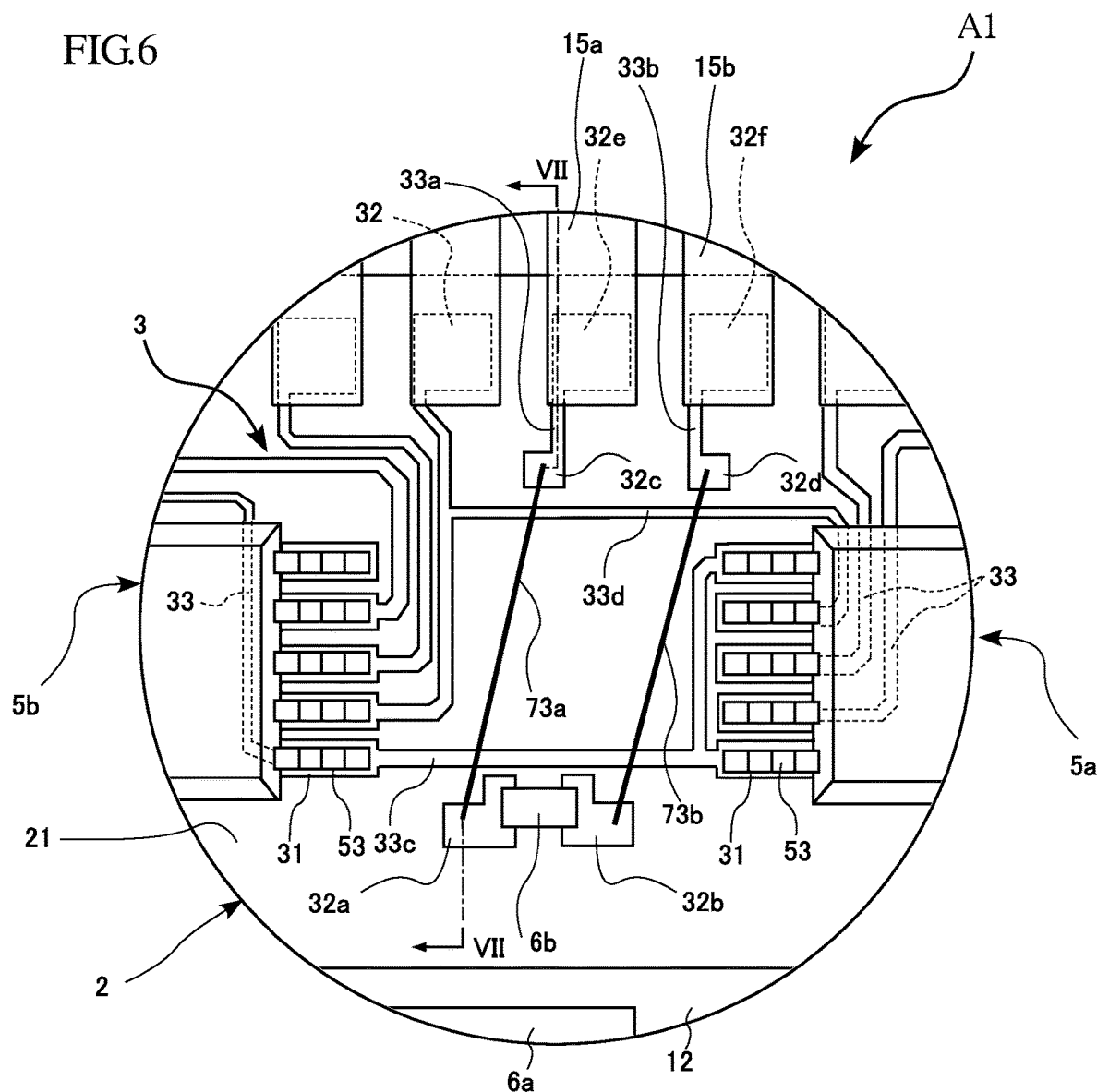
FIG. 6 is a partially enlarged plan view from FIG. 3.
Figure 7:
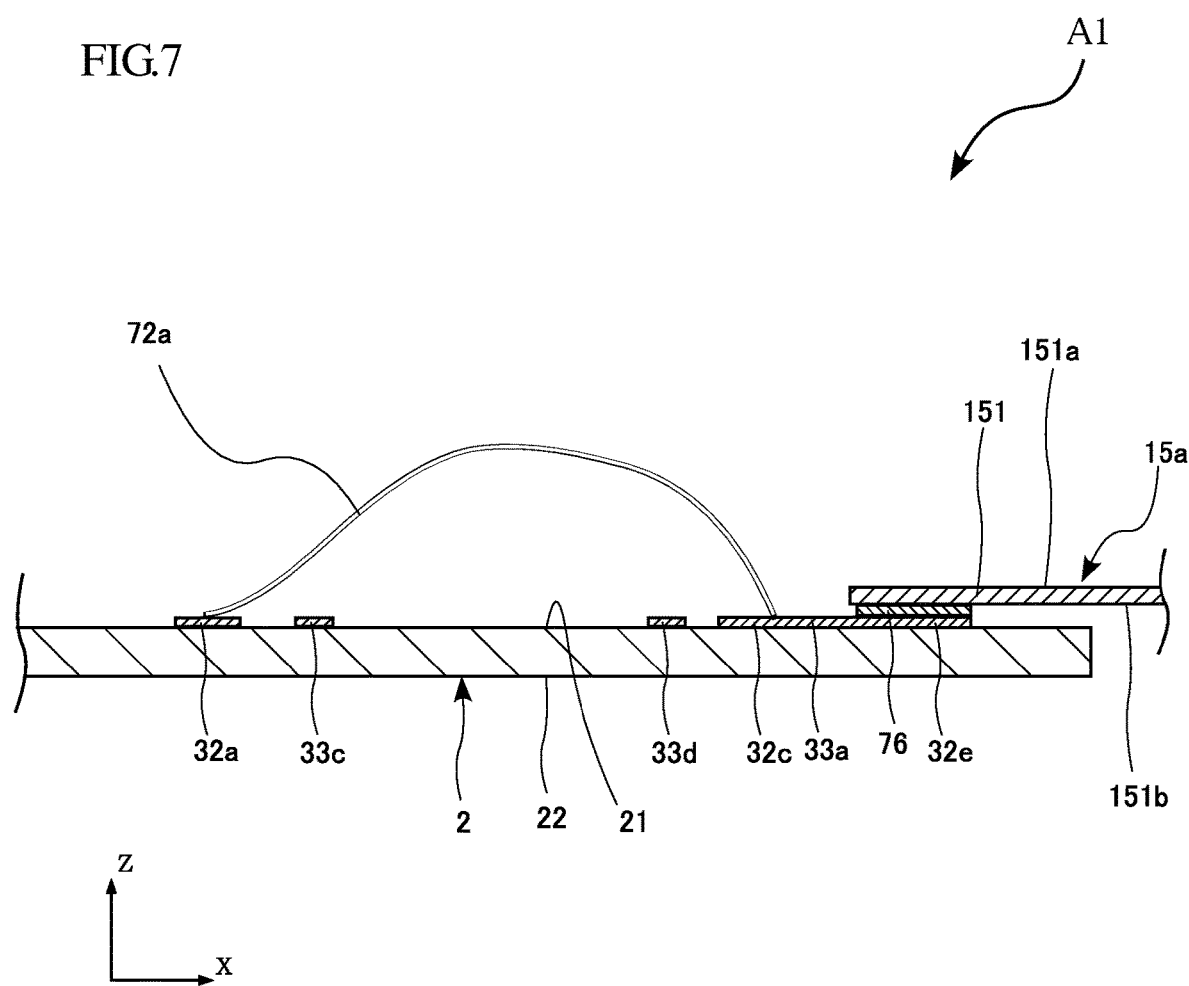
FIG. 7 is across-sectional view taken along a line VII-VII in FIG. 6.
Figure 8:
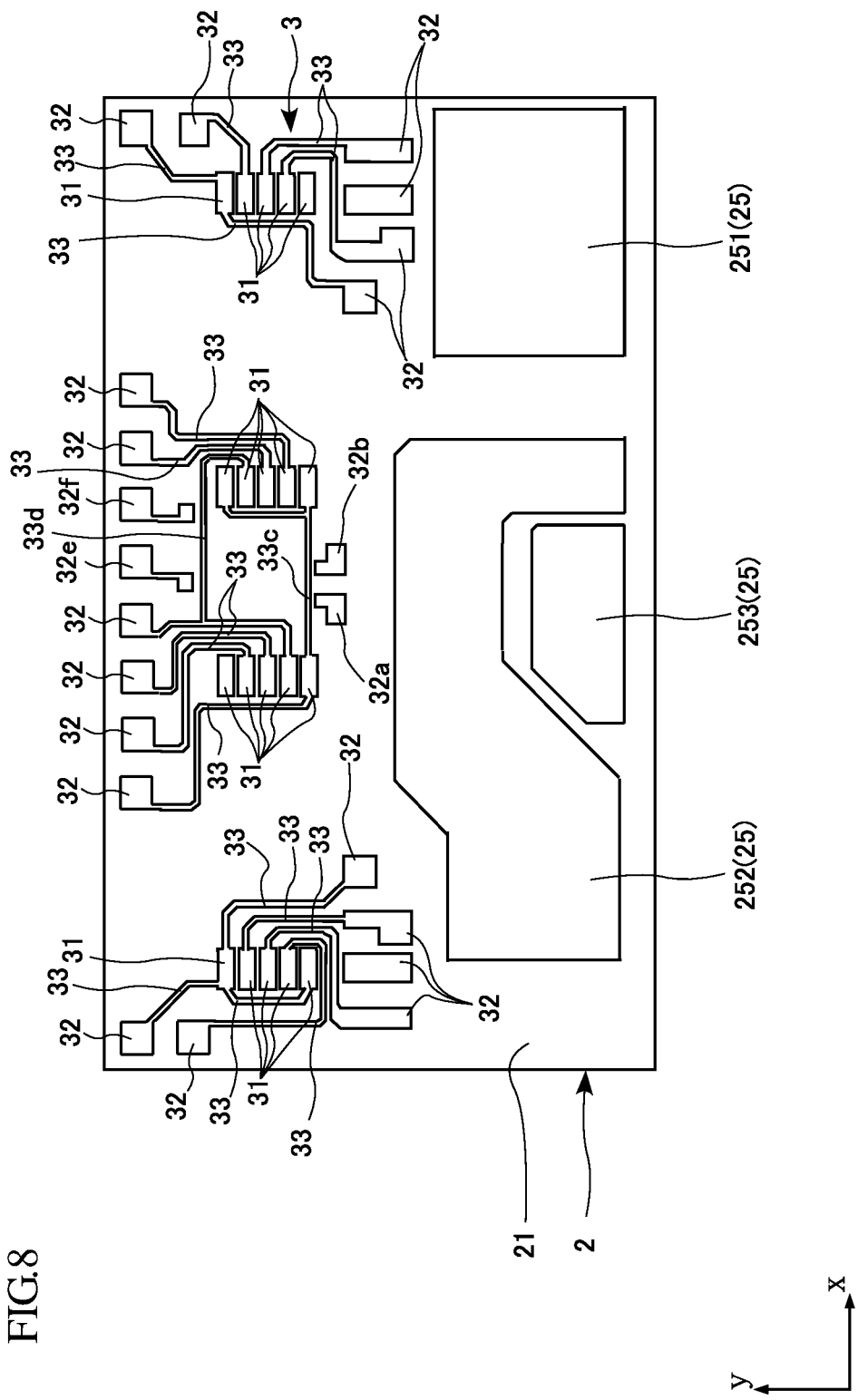
FIG. 8 is a plan view showing a substrate of the semiconductor device of FIG. 1.

FIG. 1 is a perspective view showing the semiconductor device A1. FIG. 2 is a plan view showing the semiconductor device A1. FIG. 3 is a plan view showing the semiconductor device A1, seen through the sealing resin 8. In FIG. 3, the outer shape pf the sealing resin 8 is indicated by imaginary lines (dash-dot-dot lines). FIG. 4 is a bottom view showing the semiconductor device A1. FIG. 5 is a cross-sectional view taken along a line V-V in FIG. 3. FIG. 6 is a partially enlarged plan view from FIG. 3. FIG. 7 is across-sectional view taken along a line VII-VII in FIG. 6. FIG. 8 is a plan view showing the substrate 2 of the semiconductor device A1.

For the convenience in description, the thickness direction of the substrate 2 will be defined as z-direction, as shown in FIG. 1. There are two mutually perpendicular directions, each of which is perpendicular to the z-direction, and one of them will be defined as x-direction, and the other as y-direction. As shown in FIG. 2 to FIG. 4, the x-direction extends along a pair of sides of the substrate 2 parallel to each other. The y-direction extends along the other pair of sides of the substrate 2 parallel to each other. A view in the z-direction (view in the thickness direction) may be expressed as plan view, where appropriate.

The substrate 2 is formed in a plate shape, and has a rectangular shape with the longer sides extending in the x-direction, as viewed in the z-direction. The thickness of the substrate 2 (size in the z-direction) is, for example, approximately 0.1 mm to 1.0 mm. The dimensions of the substrate 2 are not specifically limited. The substrate 2 is formed of an insulative material. The material of the substrate 2 is not specifically limited. It is preferable to form the substrate 2, for example with a material having higher thermal conductivity than the material of the sealing resin 8. Examples of material for the substrate 2 include ceramics such as alumina ($Al_2O_3$), silicon nitride (SiN), aluminum nitride (AlN), and zirconia-toughened alumina.

The substrate 2 includes a substrate obverse face 21 and a substrate reverse face 22. The substrate obverse face 21 and the substrate reverse face 22 are flat faces perpendicular to the z-direction, and oriented in opposite direction to each other in the z-direction. The substrate obverse face 21 is oriented upward in FIG. 5. On the substrate obverse face 21, the conductive section 3 and the plurality of bonding sections 25 are formed, and also the plurality of leads 1 and the plurality of electronic parts are mounted. The plurality of electronic parts include, for example, two semiconductor chips 4, two control devices 5, and a plurality of passive elements 6. Thus, the "electronic parts" are not just conductive bodies, but each have a predetermined function. The substrate reverse face 22 is oriented downward in FIG. 5. As shown in FIG. 4, the substrate reverse face 22 is exposed from the sealing resin 8. The substrate obverse face 21 and the substrate reverse face 22 both have a rectangular shape. The shape of the substrate 2 is not limited to the illustrated example.

The conductive section 3 is formed on the substrate 2. In this embodiment, the conductive section 3 is formed on the substrate obverse face 21 of the substrate 2. The conductive section 3 is formed of a conductive material. Examples of the conductive material include, but are not limited to, silver (Ag), copper (Cu), and gold (Au). Alternatively, the conductive section 3 may be formed of a conductive material containing the cited metal. For the following description, it will be assumed that the conductive section 3 contains silver. Here, the conductive section 3 may contain copper instead of silver, or gold instead of silver or copper. Further, the conductive section 3 may contain Ag—Pt or Ag—Pd. The forming method of the conductive section 3 is not specifically limited but, for example, the conductive section 3 may be formed by sintering a paste containing the above-cited metal. The thickness of the conductive section 3 may be, for example, approximately 5 μm to 30 μm, without limitation thereto.

The shape of the conductive section 3 is not specifically limited. In this embodiment, the conductive section 3 includes, as shown in FIG. 8, a plurality of first pads 31, a plurality of second pads 32, and a plurality of connection wirings 33. The first pads 31 each have, for example, an elongate rectangular shape, and a control device 5 (5a, 5b) is conductively bonded thereto (see FIG. 3). The shape of the first pad 31 is not specifically limited. The plurality of first pads 31 are spaced apart from one another.

The second pads 32 each have, for example, a rectangular shape, and the leads 15 (subsequently described), the passive element 6, and one of the wires 72, 73a, and 73b are conductively bonded to the second pads 32. The shape of the second pad 32 is not specifically limited. The plurality of second pads 32 are spaced apart from one another. As shown in FIG. 6, the plurality of second pads 32 include second pads 32a, 32b, 32c, 32d, 32e, and 32f. To the second pads 32a and 32b, the passive element 6 (thermistor 6b) is conductively bonded. In addition, the wire 73a is conductively bonded to the second pad 32a, and the wire 73b is conductively bonded to the second pad 32b. To the second pad 32c, the wire 73a is conductively bonded. To the second pad 32d, the wire 73b is conductively bonded. To the second pads 32e and 32f, the leads 15 (lead 15a and 15b) are conductively bonded.

As shown in FIG. 6 and FIG. 8, the connection wirings 33 are connected to at least one of the first pads 31, or at least one of the second pads 32. To be more detailed, the plurality of connection wirings 33 include connection wirings each having two ends, and connection wirings each branched halfway thus having three ends (see 33c and 33d in FIG. 6). Here, the present disclosure is not limited to the mentioned example, but may employ a connection wiring having four or more ends. In the illustrated example, the plurality of connection wirings 33 include three types of connection wiring, namely (1) connection wiring connected to one of the first pads 31 and one of the second pads 32, (2) connection wirings connected to at least two first pads 31, and (3) connection wirings connected to two second pads 32. In the example shown in FIG. 6, the connection wiring 33a is connected to two second pads (32c and 32e), and the connection wiring 33b is also connected to two second pads (32d and 32f). The connection wiring 33c is connected to three first pads 31 (two bonded to the control device 5a, and one bonded to the control device 5b). The connection wiring 33d is connected to two first pads 31 (one bonded to the control device 5a, and one bonded to the control device 5b) and to one second pad 32 to which the lead 15 is bonded. Here, some of the first pads 31 and the second pads 32 are connected to none of the connection wirings 33.

In this embodiment, at least one of the plurality of connection wirings 33 includes a portion overlapping with the control device 5, as viewed in the z-direction. In other words, such a connection wiring 33 includes a portion arranged between the substrate obverse face 21 and the control device 5. The connection wirings having the portion overlapping with the control device 5 may hereinafter be referred to as "overlapping wiring". In the example shown in FIG. 6, a plurality of overlapping wirings are employed.

The plurality of bonding sections 25 are formed on the substrate 2, as shown in FIG. 8. In this embodiment, the substrate obverse face 21 (more broadly, the substrate 2) includes two edges spaced apart from each other in the y-direction (each extending in the x-direction), and the plurality of bonding sections 25 are located close to one of such edges. The material of the bonding section 25 is not specifically limited but, for example, a material capable of bonding the substrate 2 and the lead 1 together may be employed. The bonding section 25 is, for example, formed of a conductive material. The conductive material for forming the bonding section 25 is not specifically limited. Examples of the conductive material for forming the bonding section 25 include a material containing silver (Ag), copper (Cu), or gold (Au). For the following description, it will be assumed that the bonding section 25 contains silver. The bonding section 25 according to this embodiment is formed of the same conductive material as that employed for the conductive section 3. Here, the bonding section 25 may contain copper instead of silver, or gold instead of silver or copper. Further, the bonding section 25 may contain Ag—Pt or Ag—Pd. The forming method of the bonding section 25 is not specifically limited but, for example, the bonding section 25 may be formed, like the conductive section 3, by sintering a paste containing the above-cited metal. The thickness of the bonding section 25 may be, for example, approximately 5 µm to 30 µm, without limitation thereto.

In this embodiment, the plurality of bonding sections 25 includes three bonding sections 251, 252, and 253, as shown in FIG. 8. The bonding sections 251, 252, and 253 are spaced apart from one another. The substrate obverse face 21 (more broadly, the substrate 2) includes two edges spaced apart from each other in the x-direction (each extending in the y-direction), and the bonding section 251 is located close to one of such edges. To the bonding section 251, the lead 11 (subsequently described) is bonded. The bonding section 253 is formed in a central portion of the substrate obverse face 21 in the x-direction. To the bonding section 253, the lead 13 (subsequently described) is bonded. The bonding section 252 is formed so as to surround at least a part of the bonding section 251. To the bonding section 252, the lead 12 (subsequently described) is bonded. Here, the shape and location of the bonding sections 251, 252, and 253 are not limited to the mentioned example.

The plurality of leads 1 each contain a metal, having higher thermal conductivity, for example, than the substrate 2. The metal for forming the lead 1 is not specifically limited but, for example, copper (Cu), aluminum, iron (Fe), oxygen-free copper, or an alloy thereof (e.g., a Cu—Sn alloy, a Cu—Zr alloy, or a Cu—Fe alloy). The plurality of leads 1 may each be plated with nickel (Ni). The plurality of leads 1 may be formed by pressing a metal plate with a die, or patterning a metal plate by etching. The forming method of the plurality of leads 1 is not specifically limited. The thickness of the leads 1 may be, for example, approximately 0.4 mm to 0.8 mm, without limitation thereto. The leads 1 are spaced apart from one another.

In this embodiment, the plurality of leads 1 include the lead 11, the lead 12, the lead 13, the lead 14, and a plurality of leads 15. The lead 11, the lead 12, the lead 13, and the lead 14 each constitute a conduction path to the semiconductor chip 4. The plurality of leads 15 each constitute a conduction path to the control device 5 or the passive element 6.

The lead 11 is located on the substrate 2, and more accurately on the substrate obverse face 21, in this embodiment. The lead 11 exemplifies the "first lead" in the present disclosure. The lead 11 is bonded to the bonding section 25 via a bonding material 75. The bonding material 75 may be any material that is capable of bonding the lead 11 to the bonding section 25. From the viewpoint of transmission efficiency of the heat from the lead 11 to the substrate 2, it is preferable that the bonding material 75 has high thermal conductivity and, for example, silver paste, copper paste, or solder may be employed. The bonding material 75 may be formed of an insulative material such as an epoxy-based resin or a silicone-based resin. In the case where the substrate 2 is without the bonding section 25, the lead 11 may be bonded to the substrate 2.

The configuration of the lead 11 is not specifically limited. In the example shown in FIG. 5, the lead 11 includes a bonding portion 111, a protruding portion 112, an inclined portion 113, and a parallel portion 114.

The bonding portion 111 includes an obverse face 111a and a reverse face 111b. The obverse face 111a and the reverse face 111b are flat faces perpendicular to the z-direction, and oriented in opposite directions to each other in the z-direction. The obverse face 111a is oriented upward in FIG. 5. To the obverse face 111a, a semiconductor chip 4a is bonded. The reverse face 111b is oriented downward. The reverse face 111b is bonded to the bonding section 25, via the bonding material 75. The inclined portion 113 and the parallel portion 114 are covered with the sealing resin 8. The inclined portion 113 is connected to the bonding portion 111 and the parallel portion 114, and inclined with respect to the bonding portion 111 and the parallel portion 114. The parallel portion 114 is connected to the inclined portion 113 and the protruding portion 112, and parallel to the bonding portion 111. The protruding portion 112 is connected to the end portion of the parallel portion 114, and corresponds to the portion of the lead 11 sticking out from the sealing resin 8. The protruding portion 112 is sticking out in the direction opposite to the bonding portion 111, in the y-direction. The protruding portion 112 serves, for example, to electrically connect the semiconductor device A1 to an external circuit. In the illustrated example, the protruding portion 112 is bent to the side to which the obverse face 111a of the bonding portion 111 is oriented, in the z-direction.

The lead 12 is located on the substrate 2, and more accurately on the substrate obverse face 21, in this embodiment. The lead 12 exemplifies the "first lead" in the present disclosure. The lead 12 is bonded to the bonding section 25 via the bonding material 75. The configuration of the lead 12 is not specifically limited. In this embodiment, the lead 12 is configured similarly to the lead 11. The lead 12 is bonded to a semiconductor chip 4b.

The lead 13 is located on the substrate 2, and more accurately on the substrate obverse face 21, in this embodiment. The lead 13 is bonded to the bonding section 25 via the bonding material 75. The configuration of the lead 13 is not specifically limited. In this embodiment, the lead 13 is configured similarly to the lead 11. The lead 13 is not bonded to the semiconductor chip 4.

In this embodiment, the lead 14 is not located on the substrate 2, and is without a portion corresponding to the bonding portion 111 and the inclined portion 113 of the lead 11. Here, the configuration of the lead 14 is not limited to the above.

The plurality of leads 15 are each located on the substrate 2, and more accurately on the substrate obverse face 21, in this embodiment. The leads 15 each exemplify the "second lead" in the present disclosure. The leads 15 are each bonded to the second pad 32 of the conductive section 3, via a conductive bonding material 76. The conductive bonding material 76 may be any material that is capable of bonding the lead 15 to the second pad 32, and electrically connecting the lead 15 and the second pad 32. For example, silver paste, copper paste, or solder may be employed as the conductive bonding material 76. The plurality of leads 15 include, as shown in FIG. 6, leads 15a and 15b. The lead 15a is conductively bonded to the second pad 32e. The lead 15b is conductively bonded to the second pad 32f.

The configuration of the lead 15 is not specifically limited. In the example according to this embodiment shown in FIG. 5, the lead 15 includes a bonding portion 151, a protruding portion 152, an inclined portion 153, and a parallel portion 154.

The bonding portion 151 includes an obverse face 151a and a reverse face 151b. The obverse face 151a and the reverse face 151b are flat faces perpendicular to the z-direction, and oriented in opposite directions to each other in the z-direction. The obverse face 151a is oriented upward. The reverse face 151b is oriented downward. The reverse face 151b is bonded to the second pad 32, via the conductive bonding material 76. The inclined portion 153 and the parallel portion 154 are covered with the sealing resin 8. The inclined portion 153 is connected to the bonding portion 151 and the parallel portion 154, and inclined with respect to the bonding portion 151 and the parallel portion 154. The parallel portion 154 is connected to the inclined portion 153 and the protruding portion 152, and parallel to the bonding portion 151. The protruding portion 152 is connected to the end portion of the parallel portion 154, and corresponds to the portion of the lead 15 sticking out from the sealing resin 8. The protruding portion 152 is sticking out in the direction opposite to the bonding portion 151, in the y-direction. The protruding portion 152 serves, for example, to electrically connect the semiconductor device A1 to an external circuit. In the illustrated example, the protruding portion 152 is bent to the side to which the obverse face 151a of the bonding portion 151 is oriented, in the z-direction.

The two semiconductor chips 4 are each located on one of the leads 1. To distinguish between the two semiconductor chips 4, one will be referred to as semiconductor chip 4a, and the other will be referred to as semiconductor chip 4b. When such distinction is unnecessary, the two semiconductor chips will simply be referred to as semiconductor chip 4. The type and the function of the semiconductor chip 4 are not specifically limited. In this embodiment, it will be assumed that the semiconductor chip 4 is a power transistor for controlling power. The semiconductor chip 4 is, for example, a metal-oxide-semiconductor field-effect transistor (MOSFET) based on a silicon carbide (SiC) substrate. Here, the semiconductor chip 4 may be a MOSFET based on a silicon (Si) substrate instead of the SiC substrate, and may include, for example, an IGBT element. Further, the semiconductor chip 4 may be a MOSFET containing gallium nitride (GaN). Although the semiconductor device A1 includes two semiconductor chips 4 in this embodiment, this is merely an example, and the number of semiconductor chips 4 is not specifically limited.

The semiconductor chip 4 has a rectangular plate shape as viewed in the z-direction, and includes an element obverse face 41, an element reverse face 42, a source electrode 43, a gate electrode 44, and a drain electrode 45. The element obverse face 41 and the element reverse face 42 are oriented in opposite directions to each other, in the z-direction. The element obverse face 41 is oriented upward, and the element reverse face 42 is oriented downward. As shown in FIG. 3, the source electrode 43 and the gate electrode 44 are located on the element obverse face 41. On the element reverse face 42, the drain electrode 45 is located. The type and location of the source electrode 43, the gate electrode 44, and the drain electrode 45 are not specifically limited.

As shown in FIG. 3 and FIG. 5, the semiconductor chip 4a is located on the lead 11. The semiconductor chip 4a is, as shown in FIG. 5, bonded to the lead 11 via a non-illustrated conductive bonding material, with the element reverse face 42 opposed to the lead 11. Accordingly, the drain electrode 45 of the semiconductor chip 4a is conductively connected to the lead 11, via the conductive bonding material. The conductive bonding material is, for example, formed of silver paste, copper paste, or solder. As shown in FIG. 3, the source electrode 43 of the semiconductor chip 4a is conductively connected to the lead 12, via the wires 71. The wires 71 are, for example, formed of aluminum (Al) or copper (Cu). The material, the line diameter, and the number of wires 71 are not specifically limited. The semiconductor chip 4b is located on the lead 12, as shown in FIG. 3. The semiconductor chip 4b is bonded to the lead 12 via a non-illustrated conductive bonding material, with the element reverse face 42 opposed to the lead 12. Accordingly, the drain electrode 45 of the semiconductor chip 4b is conductively connected to the lead 12, via the conductive bonding material. As shown in FIG. 3, the source electrode 43 of the semiconductor chip 4b is conductively connected to the lead 14, via the wires 71. Thus, a bridge circuit is formed, in which the drain electrode 45 of the semiconductor chip 4a and the source electrode 43 of the semiconductor chip 4b are connected.

As shown in FIG. 3, the source electrode 43 and the gate electrode 44 of the semiconductor chip 4a are each conductively connected to the control device 5a, via the wire 72 and the conductive section 3. The wire 72 is, for example, formed of gold (Au), silver (Ag), copper (Cu), or aluminum (Al). The material, the line diameter, and the number of wires 72 are not specifically limited. The control device 5a inputs a drive signal to the gate electrode 44 of the semiconductor chip 4a. Likewise, the source electrode 43 and the gate electrode 44 of the semiconductor chip 4b are each conductively connected to the control device 5b, via the wire 72 and the conductive section 3. The control device 5b inputs a drive signal to the gate electrode 44 of the semiconductor chip 4b. When a DC voltage is applied between the lead 11 and the lead 14, and the drive signal is inputted to the gate electrode 44 of the semiconductor chips 4a and 4b, a switching signal for switching the voltage according to the drive signal is outputted from the lead 12.

The two control devices 5, which respectively serve to control the operation of the semiconductor chips 4, are located on the substrate obverse face 21 of the substrate 2. To distinguish between the two control devices 5, one will be referred to as control device 5a, and the other will be referred to as control device 5b. When such distinction is unnecessary, the two control devices will simply be referred to as control device 5. The control device 5a controls the operation of the semiconductor chip 4a, and the control device 5b controls the operation of the semiconductor chip 4b. As shown in FIG. 5, the control device 5 is located between the semiconductor chip 4 and the lead 15, as viewed in the x-direction. In addition, as shown in FIG. 3, the control device 5a overlaps with the semiconductor chip 4a, and the control device 5b overlaps with the semiconductor chip 4b, as viewed in the y-direction. The location of the control device 5a and the control device 5b is not specifically limited.

The control device 5 includes a control chip, a die pad, a plurality of wires, a plurality of leads 53, and a resin 54. The control chip is an integrated circuit for controlling the operation of the semiconductor chip 4, and outputs a drive signal for driving the semiconductor chip 4. The die pad and the plurality of leads 53 are plate-shaped members, for example formed of copper (Cu). On the die pad, the control chip is mounted. The leads 53 are each connected to the control chip, via the wire. The resin 54 covers the entirety of the control chip and the wires, and a part of the leads 53, and is formed of, for example, an insulative material such as an epoxy resin or silicone gel.

As shown in FIG. 3, the leads 53 are aligned in the y-direction at predetermined intervals, along the respective edges of the resin 54 in the x-direction. The leads 53 each extend in the x-direction, such that a part of each lead 53 protrudes from one of the edges of the resin 54 in the x-direction. The portion of each lead 53 protruding from the resin 54 is conductively bonded to the first pad 31 of the conductive section 3. In this embodiment, the control device 5 is a small outline package (SOP). However, the package type of the control device 5 is not limited to SOP and, for example, may be a different type such as a quad flat package (QFP) or a small outline j-lead package (SOJ). The leads 53 are each bonded to the first pad 31 of the conductive section 3, via the conductive bonding material 76.

The control device 5 includes an opposing face. The opposing face is the face to be opposed to the substrate obverse face 21, when the control device 5 is mounted on the substrate 2 (see FIG. 5), and the resin 54 is provided over the entirety of the opposing face. In this embodiment, a part of the connection wiring 33 (overlapping wiring) overlaps with the control device 5 as viewed in the z-direction, and is located between the substrate obverse face 21 of the substrate 2 and the opposing face of the control device 5. control device 5は, Since the control chip is covered with the resin 54, and the resin 54 is provided over the opposing face, the control chip is prevented from contacting the overlapping wiring. In the case where the control chip is located directly on the substrate 2, instead of the control device 5, the control chip contacts the overlapping wiring, which impedes the overlapping wiring from being employed, and forces the connection wiring 33 to make a detour. The size and the shape of the control device 5, and the number of leads are not specifically limited. Further, the control device 5 may include a plurality of control chips, or another circuit chip other than the control chip.

The plurality of passive elements 6 are located on the substrate obverse face 21 of the substrate 2, and conductively bonded to the conductive section 3 or the lead 1. The passive elements 6 may be, for example, a resistor, a capacitor, a coil, and a diode. The passive elements 6 include a shunt resistor 6a and a thermistor 6b.

The shunt resistor 6a is located so as to span between the lead 12 and the lead 13, and conductively bonded to the lead 12 and the lead 13. The shunt resistor 6a causes the lead 13 to output a shunt current, branched from the current flowing to the lead 12.

The thermistor 6b is conductively bonded to the second pad 32a and the second pad 32b of the conductive section 3. The second pad 32a is conductively connected to the second pad 32c, via the wire 73a. The second pad 32b is conductively connected to the second pad 32d, via the wire 73b. The wires 73a and 73b are, for example, formed of gold (Au), silver (Ag), copper (Cu), or aluminum (Al). The material, the line diameter, and the number of wires 73a are 73b are not specifically limited. In this embodiment, the wires 73a and 73b are formed of the same material and in the same line diameter, as the wire 72. The second pad 32c is conductively connected to the lead 15a, via the connection wiring 33a and the second pad 32e. The second pad 32d is conductively connected to the lead 15b, via the connection wiring 33b and the second pad 32f. Therefore, the second pad 32a, the wire 73a, the second pad 32c, the connection wiring 33a, and the second pad 32e constitute the conduction path for conductively connecting the thermistor 6b and the lead 15a. Likewise, the second pad 32b, the wire 73b, the second pad 32d, the connection wiring 33b, and the second pad 32f constitute the conduction path for conductively connecting the thermistor 6b and the lead 15b. When a voltage is applied between the lead 15a and the lead 15b, the thermistor 6b outputs a current according to the ambient temperature. In this embodiment, the thermistor 6b exemplifies the "electronic parts" or "bonded electronic parts" in the present disclosure.

The other passive elements 6 are conductively bonded to the second pad 32 of the conductive section 3, and electrically connected to the control device 5, via the connection wiring 33 and the first pad 31. The type, the location, and the number of such other passive elements 6 are not specifically limited.

The sealing resin 8 covers at least the semiconductor chips 4a and 4b, the control devices 5a and 5b, the plurality of passive elements 6, the wires 71, 72, 73a, and 73b, a part of each of the plurality of leads 1, and a part of the substrate 2. The material of the sealing resin 8 is not specifically limited but, for example, an insulative material such as an epoxy resin or silicone gel may be employed, as appropriate.

The sealing resin 8 includes a resin obverse face 81, a resin reverse face 82, and four resin side faces 83. The resin obverse face 81 and the resin reverse face 82 are flat faces perpendicular to the z-direction, and oriented in opposite directions to each other in the z-direction. The resin obverse face 81 is oriented upward, and the resin reverse face 82 is oriented downward. The resin side faces 83 are connected to the resin obverse face 81 and the resin reverse face 82, and oriented in the x-direction or y-direction. As shown in FIG. 4, the substrate reverse face 22 of the substrate 2 is exposed from the resin reverse face 82 of the sealing resin 8. In this this embodiment, the substrate reverse face 22 and the resin reverse face 82 are flush with each other, as shown in FIG. 5.

Figure 9:
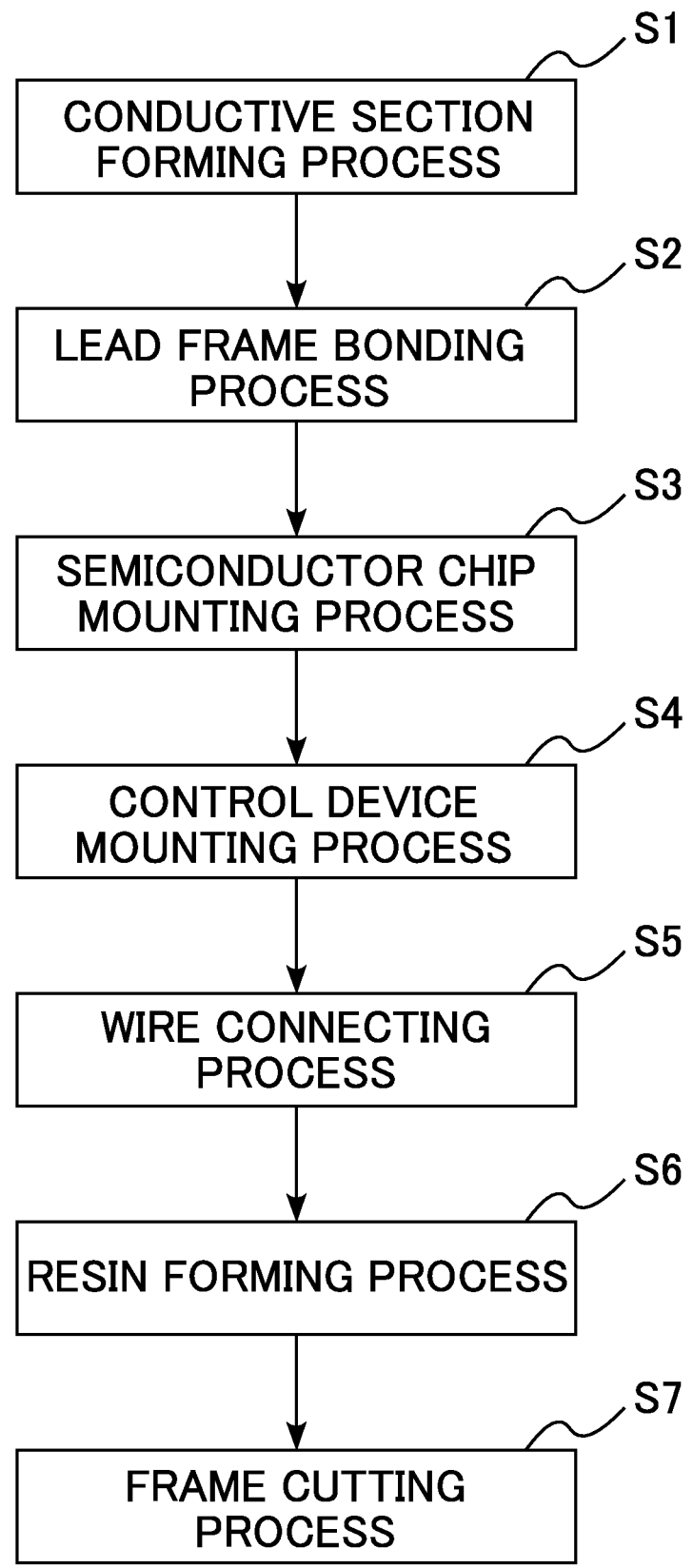
FIG. 9 is a flowchart showing a process in an exemplary manufacturing method of the semiconductor device shown in FIG. 1.

Referring now to FIG. 9, an exemplary manufacturing method of the semiconductor device A1 will be described hereunder. The manufacturing method described hereunder is a process for obtaining the semiconductor device A1, and the present disclosure is not limited to the following method.

As shown in FIG. 9, the manufacturing method of the semiconductor device A1 includes a conductive section forming process (step S1), a lead frame bonding process (step S2), a semiconductor chip mounting process (step S3), a control device mounting process (step S4), a wire connecting process (step S5), a resin forming process (step S6), and a frame cutting process (step S7).

In the conductive section forming process (step S1), first, the substrate 2 is prepared. The substrate 2 is, for example, formed of a ceramic. Then the conductive section 3 and the plurality of bonding sections 25 are formed on the substrate obverse face 21 of the substrate 2. In this example, the conductive section 3 and the plurality of bonding sections 25 are collectively formed at a time. For example, by printing a metal paste and then sintering the same, the conductive section 3 and the plurality of bonding sections 25, containing a metal that serves as the conductive material, such as silver (Ag), can be obtained.

In the lead frame bonding process (step S2), a bonding paste is printed on the plurality of bonding sections 25, and a conductive bonding paste is printed on a part of the second pad 32 of the conductive section 3. The bonding paste and the conductive bonding paste may be, for example, Ag paste or solder paste. Then the lead frame is prepared. The lead frame includes the plurality of leads 1, and also a frame to which the plurality of leads 1 are connected. The shape of the lead frame is not specifically limited. Then the leads 11, 12, and 13 out of the plurality of leads 1 are opposed to the plurality of bonding sections 25 via the bonding paste. In addition, the plurality of leads 15, out of the plurality of leads 1, are opposed to the conductive section 3 (second pad 32), via the conductive bonding paste. For example, by heating and then cooling the bonding paste and the conductive bonding paste, the bonding material 75 is obtained from the bonding paste, and the conductive bonding material 76 is obtained from the conductive bonding paste. As result, the leads 11, 12, and 13 are bonded to the plurality of bonding sections 25 via the bonding material 75, and the plurality of leads 15 are bonded to the conductive section 3, via the conductive bonding material 76.

In the semiconductor chip mounting process (step S3), the conductive bonding paste is printed on predetermined positions on the lead 11 and the lead 12. The conductive bonding paste may be, for example, Ag paste or solder paste. Then the semiconductor chip 4a is adhered to the conductive bonding paste painted on the lead 11, and the semiconductor chip 4ba is adhered to the conductive bonding paste painted on the lead 12. Thereafter, for example by heating and then cooling the conductive bonding paste, the conductive bonding material is obtained from the conductive bonding paste. As result, the semiconductor chip 4a is bonded to the lead 11 via the conductive bonding material, and the semiconductor chip 4b is bonded to the lead 12 via the conductive bonding material. Further, through the similar process, the shunt resistor 6a is bonded to the lead 12 and lead 13, via the conductive bonding material.

In the control device mounting process (step S4), the conductive bonding paste is printed on the first pad 31 of the conductive section 3. The conductive bonding paste may be, for example, Ag paste or solder paste. Then the leads 53 of the control device 5a and the control device 5b are adhered to the conductive bonding paste. Thereafter, for example by heating and then cooling the conductive bonding paste, the leads 53 of the control device 5a and the control device 5b are bonded to the first pad 31, via the conductive bonding material. Further, through the similar process, the thermistor 6b and the other passive elements 6 are bonded to the second pad 32 of the conductive section 3, via the conductive bonding material.

In the wire connecting process (step S5), the plurality of wires 71 are connected. In this example, wire materials formed of aluminum (Al) are sequentially connected, for example by a wedge bonding method. Thus, the plurality of wires 71 are obtained. Then the plurality of wires 72 are connected. In this example, wire materials formed of gold (Au) are sequentially connected, for example by a capillary bonding method. Thus, the plurality of wires 72 are obtained. Thereafter, the wires 73a and 73b are connected. In this example, wire materials formed of gold (Au) are sequentially connected, for example by the capillary bonding method. In this embodiment, the wire 73a is connected, by bonding the leading end of the wire material to the second pad 32c, moving the capillary while extruding the wire material, and bonding the wire material to the second pad 32a. Likewise, the wire 73b is connected, by bonding the leading end of the wire material to the second pad 32d, moving the capillary while extruding the wire material, and bonding the wire material to the second pad 32b. Alternatively, the wire may be bonded to the second pad 32a (32b) first.

In the resin forming process (step S6), for example, a part of the lead frame, a part of the substrate 2, the semiconductor chips 4a and 4b, the control devices 5a and 5b, the plurality of passive elements 6, and the plurality of wires 71, 72, 73a, and 73b are enclosed in a mold. A resin material in a liquid state is injected into the space defined by the mold. Then the sealing resin 8 can be obtained, by curing the resin material.

In the frame cutting process (step S7), the portions of the lead frame exposed from the sealing resin 8 are cut at predetermined positions. Accordingly, the plurality of leads 1 are divided from one another. Thereafter, for example through a process of bending the plurality of leads 1 as necessary, the semiconductor device A1 configured as above can be obtained.

The advantageous effects provided by the semiconductor device A1 will be described hereunder.

In the foregoing embodiment, the conductive section 3 is formed on the substrate obverse face 21. The conductive section 3 includes the plurality of first pads 31, to which the control device 5 is conductively bonded. Accordingly, the conductive section 3 formed on the substrate obverse face 21 can serve as the conduction path to the control device 5. Therefore, the conduction paths can be formed of finer lines and in higher density, compared with the case of, for example, using a plurality of leads to constitute the conduction path. In addition, the connection wiring 33c and the connection wiring 33d are provided on the substrate obverse face 21, between the second pad 32a and the second pad 32c, and between the second pad 32b and the second pad 32d. As shown in FIG. 6, the wire 73a passes over the connection wiring 33c and the connection wiring 33d, and is conductively bonded to the second pad 32a and the second pad 32c, so that the second pad 32a and the second pad 32c are electrically connected to each other. In other words, the wire 73a overlaps with the connection wiring 33c and the connection wiring 33d, as viewed in the z-direction. Likewise, the wire 73b passes over the connection wiring 33c and the connection wiring 33d, and is conductively bonded to the second pad 32b and the second pad 32d, so that the second pad 32b and the second pad 32d are electrically connected to each other. In other words, the wire 73b overlaps with the connection wiring 33c and the connection wiring 33d, as viewed in the z-direction. Arranging thus the wires 73a and 73b allows the conduction path to be shortened, compared with the case where the connection wiring between the second pad 32a and the second pad 32c, and the connection wiring between the second pad 32b and the second pad 32d have to be routed through a long detour. In addition, a higher degree of freedom can be attained, in designing the location of the thermistor 6b and the routing of the conduction paths. Therefore, a higher degree of integration can be achieved, in the semiconductor device A1. Further, the manufacturing cost can be reduced, compared with the case of employing a layered substrate, as the substrate 2. Here, the wires 73a and 73b in the example shown in FIG. 6 exemplify, without limitation thereto, the "conductive section wire" in the present disclosure.

In this embodiment, the overlapping wiring, which is a part of the connection wiring 33 of the conductive section 3, is arranged so as to overlap with the control device 5, as viewed in the z-direction. Such an arrangement allows the conduction path to be shortened, compared with the case of arranging the conduction path through a detour, so as not to overlap with the control device 5, and also increases the degree of freedom in designing the conduction path. Consequently, a higher degree of integration can be achieved, in the semiconductor device A1.

In this embodiment, the plurality of leads 1 have higher thermal conductivity than the substrate 2, and therefore a decline in heat dissipation performance from the semiconductor chip 4, which may arise from the presence of the substrate 2, can be prevented. In addition, the semiconductor chip 4a is directly bonded to the lead 11 via the conductive bonding material, and the semiconductor chip 4b is directly bonded to the lead 12 via the conductive bonding material. Therefore, the semiconductor chip 4a (4b) and the lead 11 (12) are electrically connected to each other, and also the heat from the semiconductor chip 4a (4b) can be efficiently transmitted to the lead 11 (12). Further, since the plurality of leads 1 are exposed from the sealing resin 8, the conduction path from outside to the semiconductor chip 4 can be secured, and also the heat dissipation characteristic of the semiconductor chip 4 can be improved. In addition, the bonding section 25 is formed on the substrate 2, and the leads 11, 12, and 13 are bonded to the substrate 2, via the bonding section 25. The surface of the bonding section 25 can be made smoother, compared with the rough surface of the substrate obverse face 21 of the substrate 2, which is formed of a ceramic. Such a configuration prevents formation of undesired minute voids, in the heat transmission path from the leads 11, 12, and 13 to the substrate 2, thereby further improving the heat dissipation performance of the semiconductor chip 4. Further, the substrate reverse face 22 of the substrate 2 is exposed from the sealing resin 8. Therefore, the heat transmitted from the semiconductor chip 4 to the substrate 2 can be more efficiently emitted to outside.

In this embodiment, the conductive section 3 and the bonding section 25 are formed of the same conductive material, and therefore the conductive section 3 and the bonding section 25 can be collectively formed at a time, on the substrate 2. This contributes to improving the manufacturing efficiency of the semiconductor device A1. The plurality of leads 15 are bonded to the second pad 32 of the conductive section 3, via the conductive bonding material 76. Accordingly, the plurality of leads 15 can be fixed to the substrate 2, with an increased strength. In addition, the resistance between the plurality of leads 15 and the conductive section 3 can be reduced.

Although the substrate 2 is constituted of a single layer in this embodiment, the present disclosure is not limited to such a configuration. For example, the substrate 2 may be a multilayer substrate composed of a plurality of layers. In such a case also, the manufacturing cost can be reduced, for example by reducing the number of layers.

FIG. 10 to FIG. 15 illustrate other embodiments. In these drawings, the elements same as or similar to those of the first embodiment are given the same reference numeral.

Figure 10:
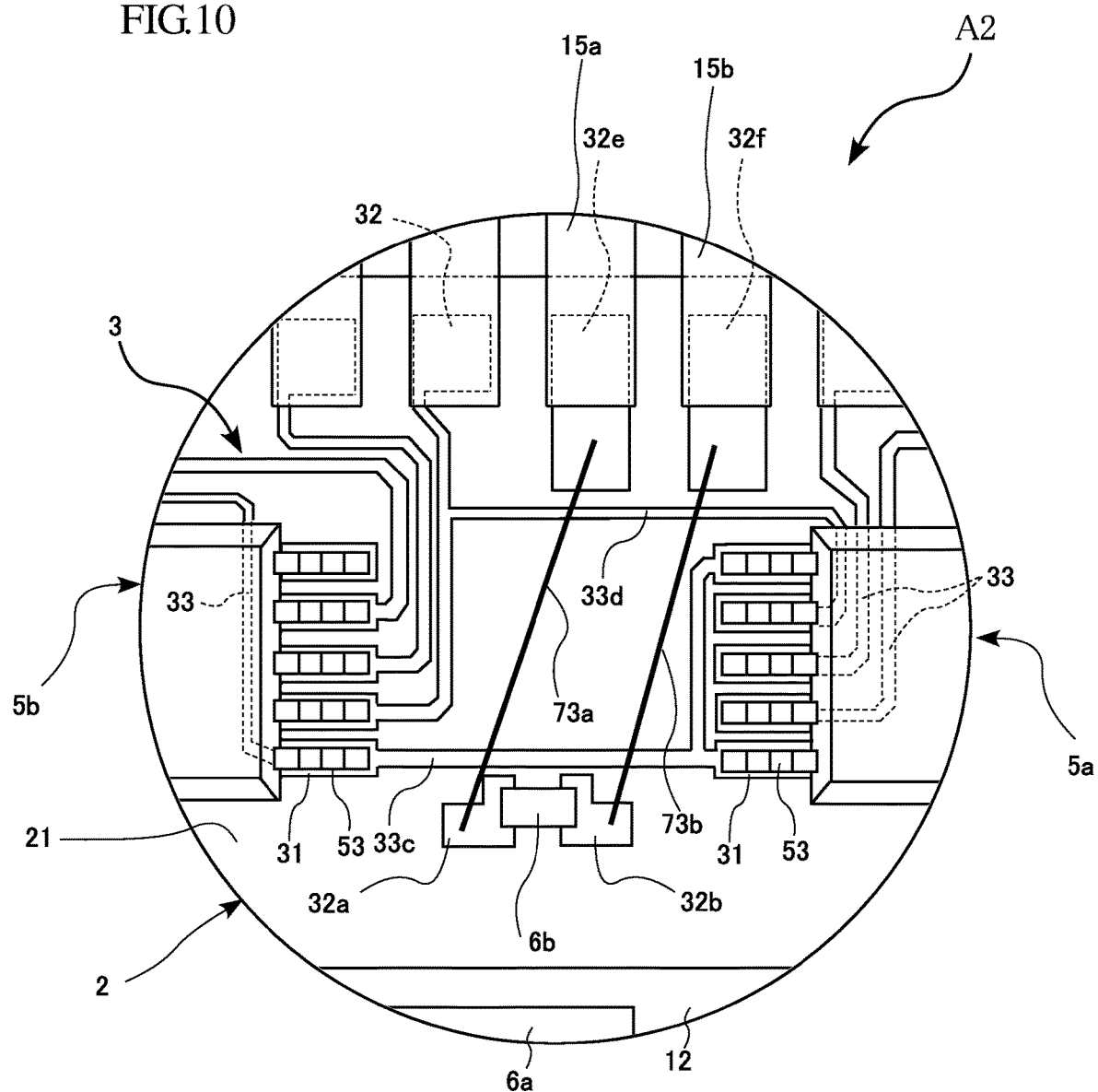
FIG. 10 is a partially enlarged plan view showing a semiconductor device according to a second embodiment.

FIG. 10 is a drawing for explaining a semiconductor device A2 according to a second embodiment. FIG. 10 is a partially enlarged plan view of the semiconductor device A2, showing the portion corresponding to FIG. 6. In FIG. 10, the sealing resin 8 is excluded. The semiconductor device A2 is different from the semiconductor device A1, in that the wire 73a (73b) is conductively bonded to the second pad 32e (32f).

In the semiconductor device A2, the second pads 32e and 32f each have a rectangular shape elongate in the y-direction, and have a predetermined width (size in the x-direction), along the longitudinal direction. Although the second pad 32e (33f) of the semiconductor device A1 overlaps in its entirety with the lead 15a (15b), as viewed in the z-direction, a part of the second pad 32e (33f) protrudes from the lead 15a (15b) toward the connection wiring 33d, in the semiconductor device A2. In the semiconductor device A2, the second pads 32c and 32d, and the connection wirings 33a and 33b are not provided, and the wire 73a (73b) is directly bonded to the second pad 32e (32f). In the second embodiment, therefore, the lead 15a (15b) is conductively bonded to the second pad 32e (32f), to which the wire 73a (73b) is conductively bonded.

In the second embodiment, the connection wiring 33c and the connection wiring 33d are provided on the substrate obverse face 21 of the substrate 2, between the second pad 32a and the second pad 32e, and between the second pad 32b and the second pad 32f. The wire 73a passes over the connection wiring 33c and the connection wiring 33d, and is conductively bonded to the second pad 32a and the second pad 32e, so that the second pad 32a and the second pad 32e are electrically connected to each other. Likewise, the wire 73b passes over the connection wiring 33c and the connection wiring 33d, and is conductively bonded to the second pad 32b and the second pad 32f, so that the second pad 32b and the second pad 32f are electrically connected to each other. Such an arrangement allows the conduction path to be shortened, compared with the case where the connection wiring 33 between the second pad 32a and the second pad 32e, and the connection wiring 33 between the second pad 32b and the second pad 32f have to be routed through a long detour. In addition, a higher degree of freedom can be attained, in designing the location of the thermistor 6b and the routing of the conduction paths. Therefore, a higher degree of integration can be achieved, in the semiconductor device A2. Further, the manufacturing cost can be reduced by employing the single-layered substrate 2, compared with the case of employing multilayer substrate (this also applies to the following embodiments).

Figure 11:
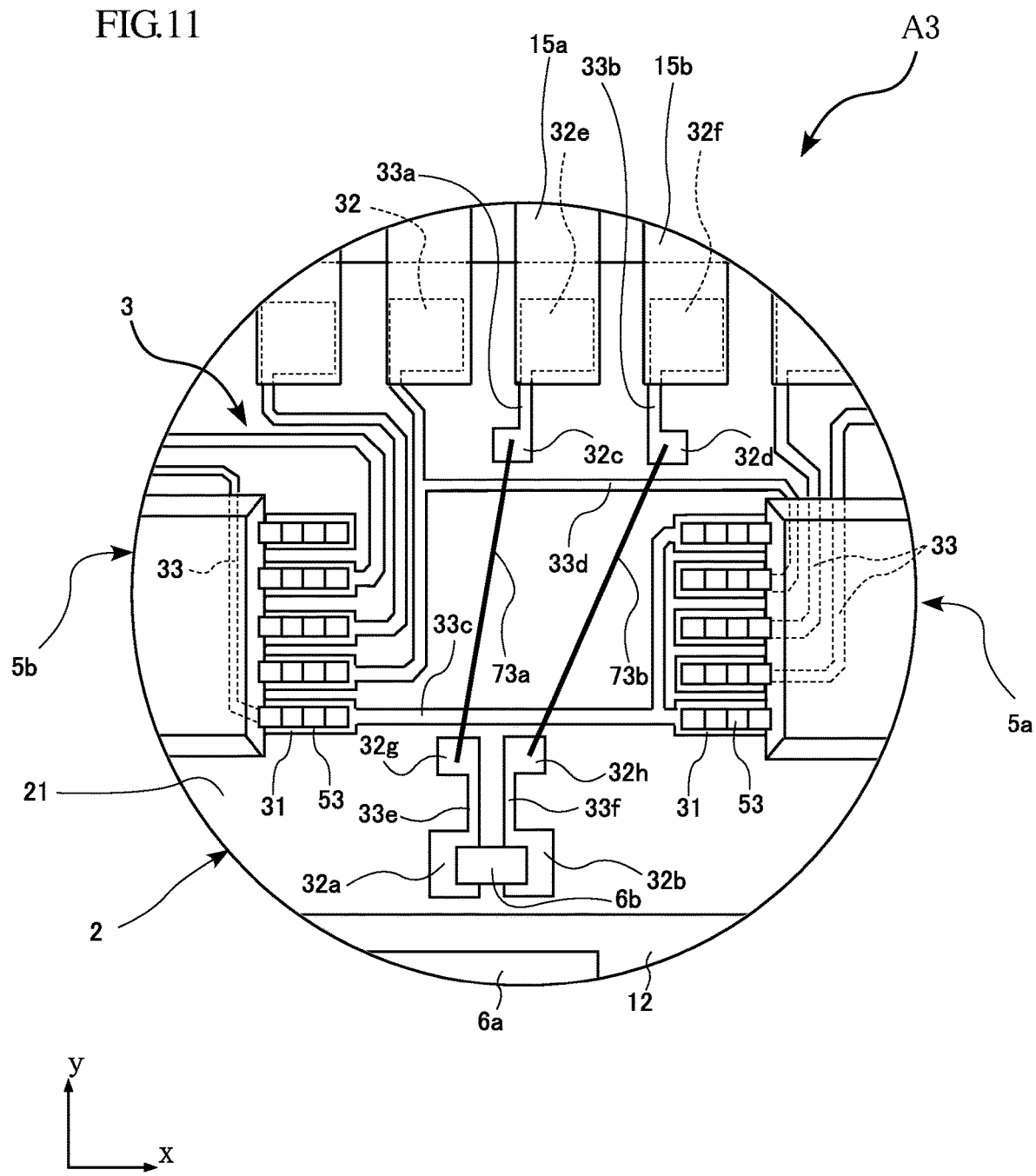
FIG. 11 is a partially enlarged plan view showing a semiconductor device according to a third embodiment.

FIG. 11 is a partially enlarged plan view for explaining a semiconductor device A3 according to a third embodiment, and shows the portion corresponding to FIG. 6. In FIG. 11, the sealing resin 8 is excluded. The semiconductor device A3 is different from the semiconductor device A1, in that the wire 73a (73b) is conductively bonded to a different second pad 32g (32h), instead of the second pad 32a (32b).

The semiconductor device A3 includes connection wirings 33e and 33f, in addition to the second pads 32g and 32h. The second pad 32g is conductively connected to the second pad 32a, via the connection wiring 33e. Likewise, the second pad 32h is conductively connected to the second pad 32b, via the, connection wiring 33f. The wire 73a (73b) is conductively bonded to the second pad 32g (32h), instead of the second pad 32a (32b) to which the thermistor 6b is conductively bonded.

In the third embodiment, the connection wiring 33c and the connection wiring 33d are provided on the substrate obverse face 21, between the second pad 32g and the second pad 32c, and between the second pad 32h and the second pad 32d. The wire 73a passes over the connection wiring 33c and the connection wiring 33d, and is conductively bonded to the second pad 32g and the second pad 32c, so that the second pad 32g and the second pad 32c are electrically connected to each other. Likewise, the wire 73b passes over the connection wiring 33c and the connection wiring 33d, and is conductively bonded to the second pad 32h and the second pad 32d, so that the second pad 32hb and the second pad 32d are electrically connected to each other. Such an arrangement allows the conduction path to be shortened, compared with the case where the connection wiring 33 between the second pad 32g and the second pad 32c, and the connection wiring 33 between the second pad 32h and the second pad 32d have to be routed through a long detour. In addition, a higher degree of freedom can be attained, in designing the location of the thermistor 6b and the routing of the conduction paths. Therefore, a higher degree of integration can be achieved, in the semiconductor device A3. Here, the wires 73a and 73b in the example shown in FIG. 11 exemplify, without limitation thereto, the "conductive section wire" in the present disclosure.

Figure 12:
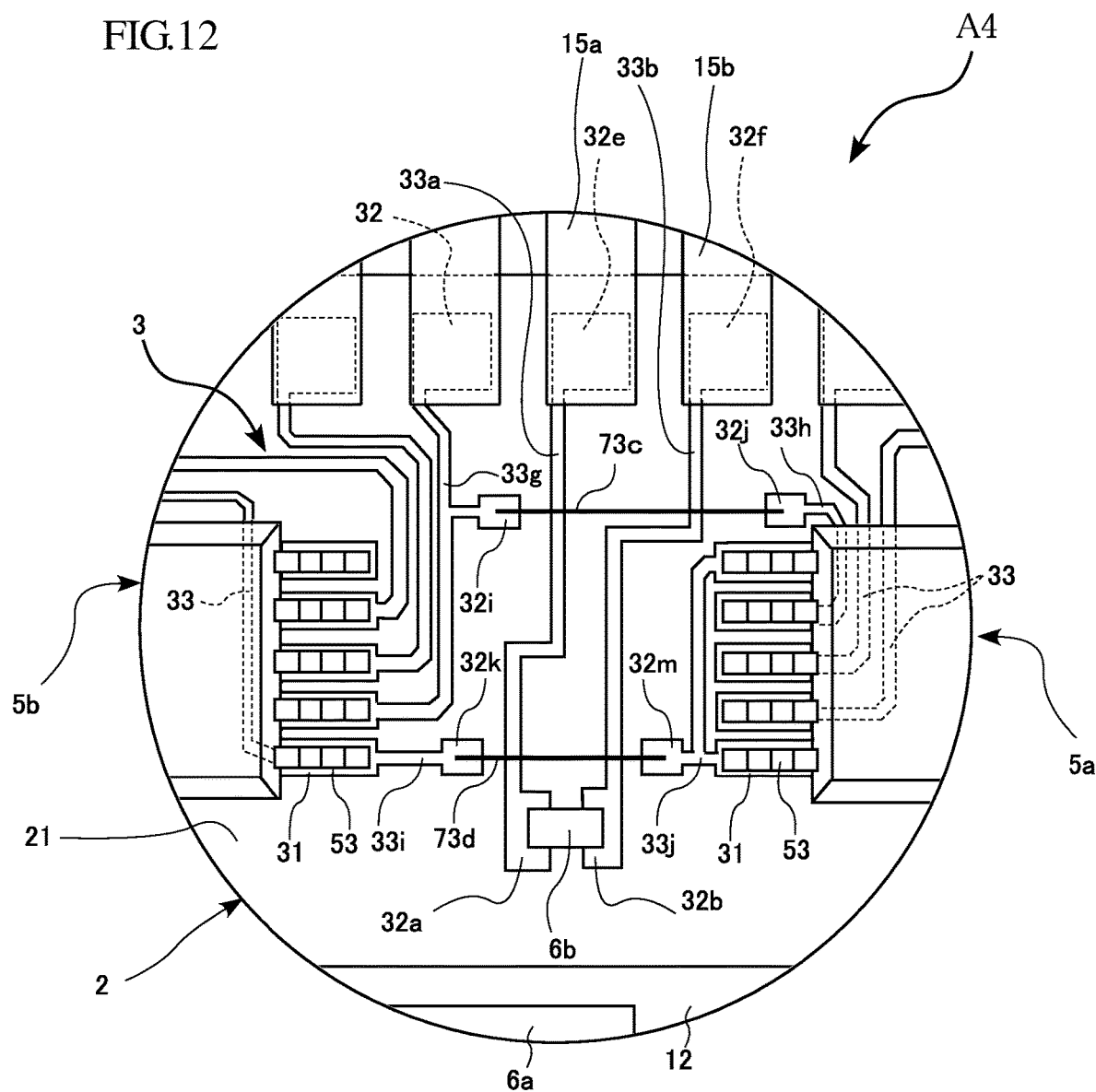
FIG. 12 is a partially enlarged plan view showing a semiconductor device according to a fourth embodiment.

FIG. 12 is a partially enlarged plan view for explaining a semiconductor device A4 according to a fourth embodiment, and shows the portion corresponding to FIG. 6. In FIG. 12, the sealing resin 8 is excluded. The semiconductor device A4 is different from the semiconductor device A1, in that the thermistor 6b is conductively connected the leads 15 (15a, 15b) via the conductive section 3 (33a, 33b), and that wires (73c, 73d) are provided so as to pass over the connection wiring 33.

The semiconductor device A4 is without the second pads 32c and 32d, and the wires 73a and 73b (see FIG. 6). Instead, the connection wiring 33a (33b) is connected to the second pad 32a (32b), in the semiconductor device A4. In other words, the second pad 32a, the connection wiring 33a, and the second pad 32e constitute the conduction path between the thermistor 6b and the lead 15a, and likewise the second pad 32b, the connection wiring 33b, and the second pad 32f constitute the conduction path between the thermistor 6b and the lead 15b.

The semiconductor device A4 includes second pads 32i, 32j, 32k, and 32m, connection wirings 33g, 33h, 33i, and 33j, and the wires 73c, 73d, in place of the connection wirings 33c and 33d (see FIG. 6). The connection wiring 33g has three ends, respectively connected to the first pad 31 (conductively bonded to the control device 5b), the second pad 32 (conductively bonded to the lead 15), and the second pad 32i. The connection wiring 33h has two ends, respectively connected to the first pad 31 (conductively bonded to the control device 5a) and the second pad 32i. The connection wiring 33i has two ends, respectively connected to the first pad 31 (conductively bonded to the control device 5b) and the second pad 32k. The connection wiring 33j has three ends, respectively connected to the two first pads 31 (conductively bonded to the control device 5a) and the second pad 32m. The wire 73c passes over the connection wiring 33a and the connection wiring 33b, and is conductively bonded to the second pad 32i and the second pad 32j. The wire 73d passes over the connection wiring 33a and the connection wiring 33b, and is conductively bonded to the second pad 32k and the second pad 32m.

In the fourth embodiment, the connection wiring 33a and the connection wiring 33b each extend on the substrate obverse face 21, so as to cross the region between the second pad 32i and the second pad 32j, and the region between the second pad 32k and the second pad 32m. The wire 73c passes over the connection wiring 33a and the connection wiring 33b, and is bonded to the second pad 32i and the second pad 32j, so that the second pad 32i and the second pad 32j are electrically connected to each other. Likewise, the wire 73d passes over the connection wiring 33a and the connection wiring 33b, and is bonded to the second pad 32k and the second pad 32m, so that the second pad 32k and the second pad 32m are electrically connected to each other. Such an arrangement allows the conduction path to be shortened, compared with the case where the connection wiring 33 between the second pad 32i and the second pad 32j, and the connection wiring 33 between the second pad 32k and the second pad 32m have to be routed through a long detour. In addition, a higher degree of freedom can be attained, in designing the location of the thermistor 6b and the routing of the conduction paths. Therefore, a higher degree of integration can be achieved, in the semiconductor device A4.

Figure 13:
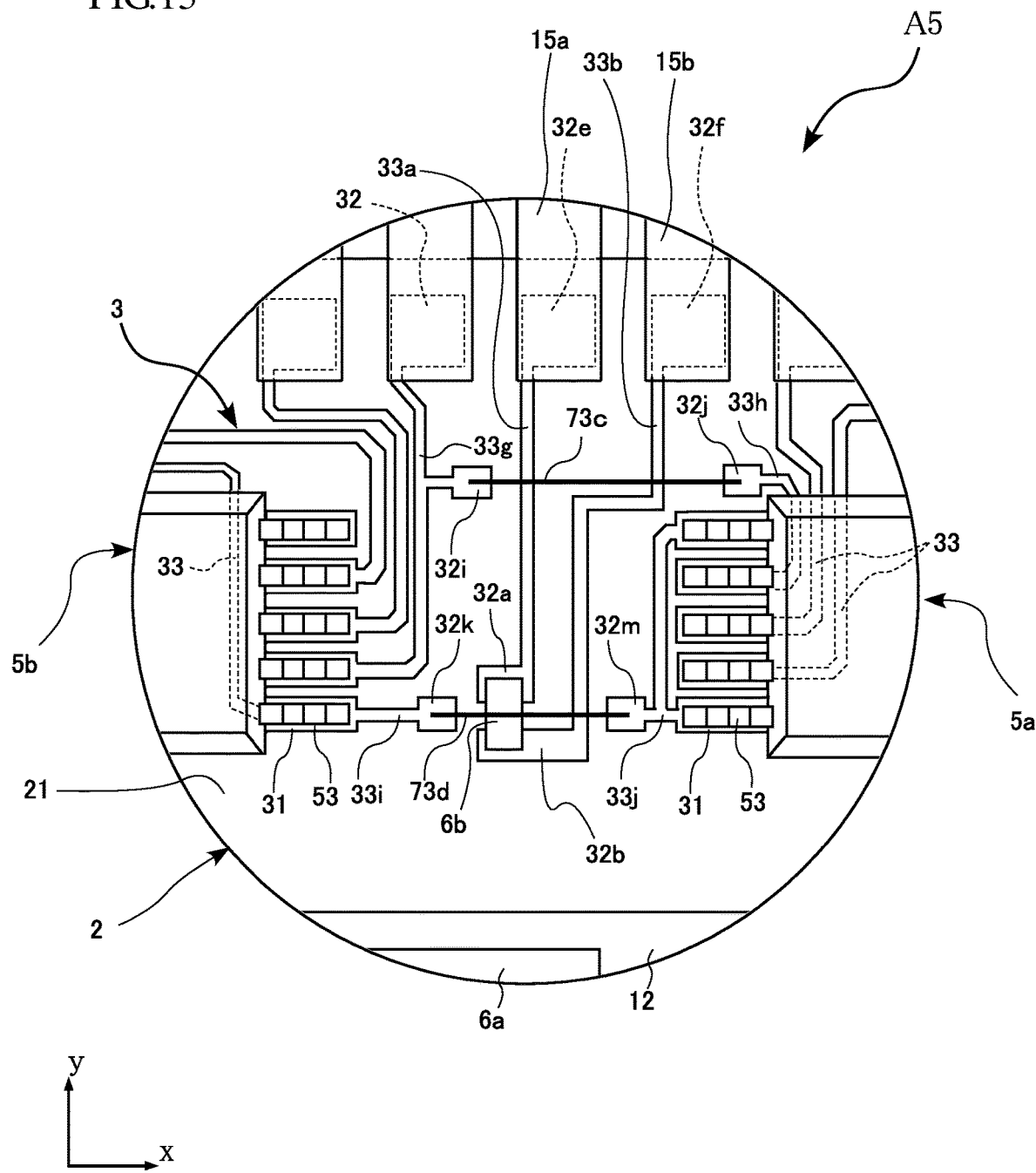
FIG. 13 is a partially enlarged plan view showing a semiconductor device according to a fifth embodiment.

FIG. 13 is a partially enlarged plan view for explaining a semiconductor device A5 according to a fifth embodiment, and shows the portion corresponding to FIG. 12. In FIG. 13, the sealing resin 8 is excluded. The semiconductor device A5 is different from the semiconductor device A4, in that the wire 73d overlaps with the thermistor 6b as viewed in the z-direction (wire 73d passes over the thermistor 6b).

In the semiconductor device A5, the second pad 32a is located on the side of the lead 15 in the y-direction, with respect to the second pads 32k and 32m, and the thermistor 6b is oriented such that the long sides are parallel to the y-direction, as viewed in the z-direction. The wire 73d passes over the thermistor 6b and the connection wiring 33b, and is conductively bonded to the second pad 32k and the second pad 32m.

In the fifth embodiment, the connection wiring 33a and the connection wiring 33b are provided on the substrate obverse face 21, in the region between the second pad 32i and the second pad 32j. In the region between the second pad 32k and the second pad 32m, the thermistor 6b and the connection wiring 33b are provided. The wire 73c passes over (across) the connection wiring 33a and the connection wiring 33b, and is conductively bonded to the second pad 32i and the second pad 32j, so that the second pad 32i and the second pad 32j are electrically connected to each other. The wire 73d passes over the thermistor 6b and the connection wiring 33b, and is conductively bonded to the second pad 32k and the second pad 32m, so that the second pad 32k and the second pad 32m are electrically connected to each other. Such an arrangement allows the conduction path to be shortened, compared with the case where the connection wiring 33 between the second pad 32i and the second pad 32j, and the connection wiring 33 between the second pad 32k and the second pad 32m have to be routed through a long detour. In addition, a higher degree of freedom can be attained, in designing the location of the thermistor 6b and the routing of the conduction paths. Therefore, a higher degree of integration can be achieved, in the semiconductor device A5.

Figure 14:
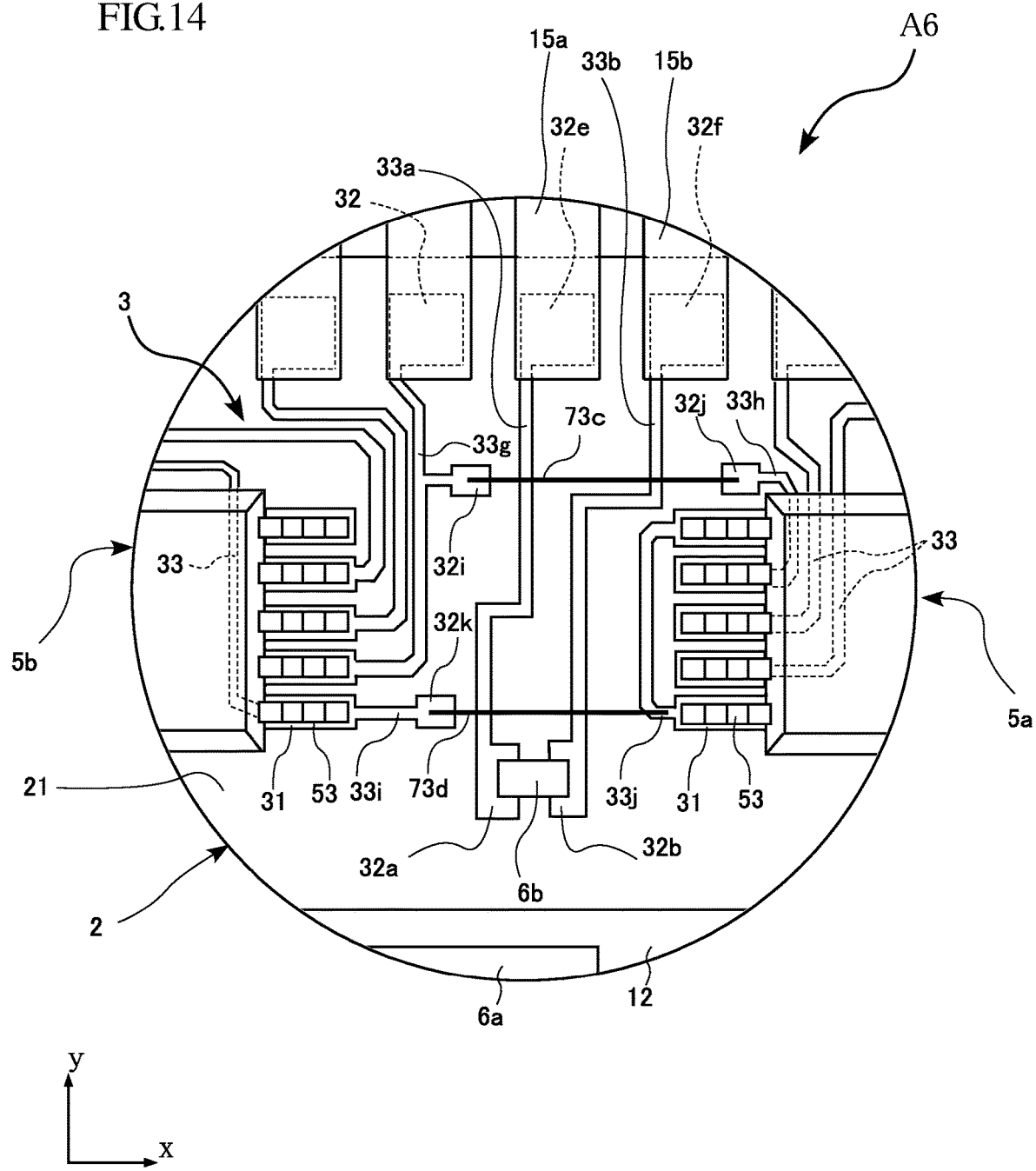
FIG. 14 is a partially enlarged plan view showing a semiconductor device according to a sixth embodiment.

FIG. 14 is a partially enlarged plan view for explaining a semiconductor device A6 according to a sixth embodiment, and shows the portion corresponding to FIG. 12. In FIG. 14, the sealing resin 8 is excluded. The semiconductor device A6 is different from the semiconductor device A4, in that the second pad 32m (see FIG. 12) is excluded, and that the wire 73d is conductively bonded to the connection wiring 33j.

The semiconductor device A6 is without the second pad 32m. The connection wiring 33j is only connected to the two first pads 31, to which the control device 5a is conductively bonded. The wire 73d passes over the connection wiring 33a and the connection wiring 33b, and is conductively bonded to the second pad 32k and the connection wiring 33j. In this embodiment, the extending direction of the wire 73d accords with the extending direction of the portion of the connection wiring 33j where the wire 73d is bonded. Such a configuration facilitates the connecting work of the wire 73d, in the wire connecting process.

In the sixth embodiment, the connection wiring 33a and the connection wiring 33b are provided on the substrate obverse face 21 of the substrate 2, in the region between the second pad 32i and the second pad 32j, and in the region between the second pad 32k and the connection wiring 33j. The wire 73c passes over the connection wiring 33a and the connection wiring 33b, and is conductively bonded to the second pad 32i and the second pad 32j, so that the second pad 32i and the second pad 32j are electrically connected to each other. The wire 73d passes over the connection wiring 33a and the connection wiring 33b, and is conductively bonded to the second pad 32k and the connection wiring 33j, so that the second pad 32k and the connection wiring 33j are electrically connected to each other. Such an arrangement allows the conduction path to be shortened, compared with the case where the connection wiring 33 between the second pad 32i and the second pad 32j, and the connection wiring 33 between the second pad 32k and the connection wiring 33j have to be routed through a long detour. In addition, a higher degree of freedom can be attained, in designing the location of the thermistor 6b and the routing of the conduction paths. Therefore, a higher degree of integration can be achieved, in the semiconductor device A6.

In the first to fifth embodiments, the both ends of the wires 73 (73a, 73b, 73c, 73d) are each conductively bonded to one of the second pads 32. In the sixth embodiment, the both ends of the wires 73, except for the wire 73d, are each conductively bonded to one of the second pads 32. The wires 73 may each be conductively bonded to one of the connection wirings 33, like the wire 73d according to the sixth embodiment. The wires 73 may each have only one end conductively bonded to the connection wiring 33, or have the both ends conductively bonded to the connection wiring 33. In this case, the space on the substrate obverse face 21 of the substrate 2 for forming the second pad 32 can be saved, which further contributes to improving the degree of integration in the semiconductor devices A1 to A5. Here, when conductively bonding the wires 73 to the connection wiring 33, it is preferable to align the extending direction of the wire 73 with the extending direction of the connection wiring 33 to a possible extent, in a view in the z-direction.

Figure 15:
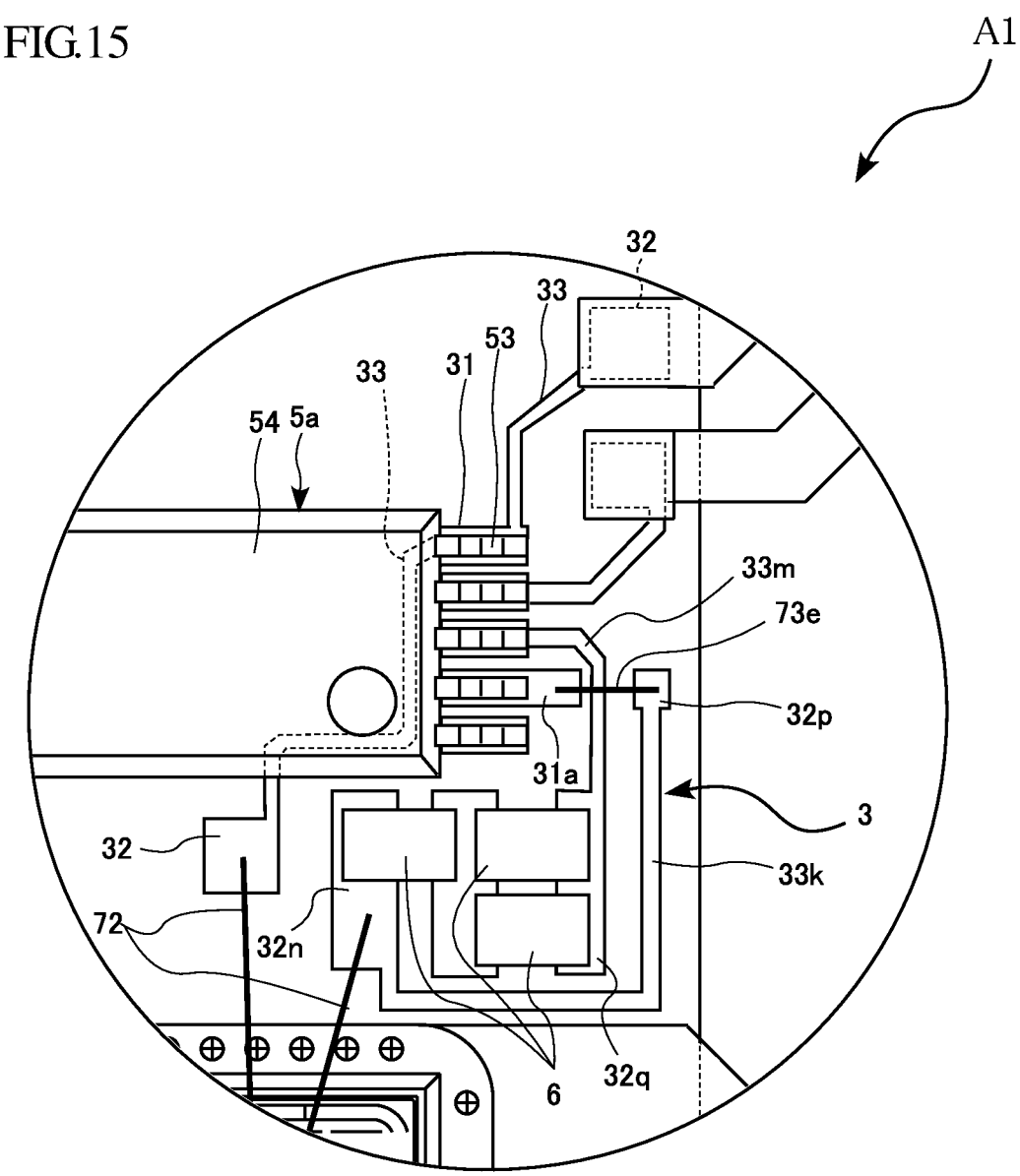
FIG. 15 is a partially enlarged plan view showing a variation of the semiconductor device according to the first embodiment.

Although various patterns of the arrangement of the wires 73 have been described in the first to sixth embodiments, the present disclosure is not limited to those examples. FIG. 15 is a partially enlarged plan view showing a variation of the semiconductor device A1 according to the first embodiment. In FIG. 15, the sealing resin 8 is excluded.

In the variation shown in FIG. 15, the plurality of first pads 31 include a first pad 31a. The first pad 31a is longer in the x-direction than the other first pads 31, and the control device 5a and a wire 73e are conductively bonded to the first pad 31a. The plurality of second pads 32 include second pads 32n, 32p, and 32q. To the second pad 32n, the passive element 6 and the wire 72 are conductively bonded. To the second pad 32p, the wire 73e is conductively bonded. To the second pad 32q, the passive element 6 is conductively bonded. The plurality of connection wirings 33 include connection wirings 33k and 33m. The connection wiring 33k is connected to the second pad 32n and the second pad 32p. The connection wiring 33m is connected to the first pad 31, to which the control device 5a is conductively bonded, and to the second pad 32d to which the passive element 6 is conductively bonded. The plurality of wires 73 include the wire 73e. The wire 73e passes over the connection wiring 33m, and is conductively bonded to the first pad 31a and the second pad 32p. Accordingly, the wire 73e is conductively bonded to the first pad 31a to which the control device 5a is conductively bonded, and to the second pad 32p conductively connected to the second pad 32n via the connection wiring 33k, the second pad 32n being conductively bonded to the passive element 6. In this variation, the control device 5a or the passive element 6 exemplifies the "electronic parts" or "bonded electronic parts" in the present disclosure.

In the foregoing variation, the passive elements 6 that are relatively large in size in the y-direction are provided. Accordingly, the second pad 32n extends to the position quite close to the control device 5a, such that a space for locating the connection wiring 33 is unable to be secured, between the second pad 32n and the control device 5a. In this case, the second pad 32n and the first pad 31a can be conductively connected to each other, via the connection wiring 33k, the second pad 32p, and the wire 73e.

Although the semiconductor devices A1 to A6 are formed as the IPM in the first to sixth embodiments, the present disclosure is not limited to those embodiments. The semiconductor device according to the present disclosure may be a semiconductor device other than the IPM.

The semiconductor device according to the present disclosure is not limited to the foregoing embodiments. The specific configuration of the elements of the semiconductor device according to the present disclosure may be modified in various manners. For example, a semiconductor device including the conductive section formed on the substrate obverse face, and the wire conductively bonded to each of the two sections spaced apart from each other in the conductive section, is encompassed in the scope of the present disclosure.

APPENDIX 1

A semiconductor device including:
- a substrate having a substrate obverse face and a substrate reverse face oriented in opposite directions to each other in a thickness direction;
- a conductive section formed of a conductive material and located on the substrate obverse face, the conductive section including a first section and a second section spaced apart from each other;
- a sealing resin covering at least a part of the substrate and an entirety of the conductive section; and
- a conductive section wire conductively bonded to the first section and the second section.

APPENDIX 2

The semiconductor device according to appendix 1, wherein the conductive section includes a third section spaced apart from the first section and the second section, and the conductive section wire overlaps with the third section, as viewed in the thickness direction.

APPENDIX 3

The semiconductor device according to appendix 1 or 2, further including electronic parts electrically connected to the conductive section, and arranged on the substrate obverse face, wherein the conductive section wire overlaps with the electronic parts, as viewed in the thickness direction.

APPENDIX 4

The semiconductor device according to any one of appendices 1 to 3, further including bonded electronic parts arranged on the substrate obverse face,
wherein the bonded electronic parts are conductively bonded to the first section.

APPENDIX 5

The semiconductor device according to any one of appendices 1 to 3, wherein the conductive section includes a first wiring connected to the first section, and a fourth section connected to the first wiring.

APPENDIX 6

The semiconductor device according to appendix 5, further including bonded electronic parts arranged on the substrate obverse face, wherein the bonded electronic parts are conductively bonded to the fourth section.

APPENDIX 7

The semiconductor device according to appendix 4 or 6, wherein the bonded electronic parts include a thermistor.

APPENDIX 8

The semiconductor device according to appendix 4 or 6, wherein the bonded electronic parts include a control device.

APPENDIX 9

The semiconductor device according to any one of appendices 1 to 8, further including:
a first lead arranged on the substrate obverse face, and higher in thermal conductivity than the substrate; and
a semiconductor chip located on the first lead.

APPENDIX 10

The semiconductor device according to appendix 9, further including a bonding section formed on the substrate obverse face, and including the conductive material constituting the conductive section,
wherein the first lead is bonded to the bonding section, via a bonding material.

APPENDIX 11

The semiconductor device according to appendix 9 or 10, wherein a part of the first lead is covered with the sealing resin, and another part is exposed from the sealing resin.

APPENDIX 12

The semiconductor device according to any one of appendices 9 to 11, further including a second lead spaced apart from the first lead, and bonded to the conductive section via a conductive bonding material,
wherein a part of the second lead is covered with the sealing resin, and another part is exposed from the sealing resin.

APPENDIX 13

The semiconductor device according to appendix 12, wherein the second lead is conductively bonded to the second section.

APPENDIX 14

The semiconductor device according to appendix 12, wherein the conductive section further includes a second wiring connected to the second section, and a fifth section connected to the second wiring.

APPENDIX 15

The semiconductor device according to appendix 14, wherein the second lead is conductively bonded to the fifth section.

APPENDIX 16

The semiconductor device according to any one of appendices 9 to 15, wherein the semiconductor chip is a power transistor.

APPENDIX 17

The semiconductor device according to any one of appendices 9 to 16, wherein the semiconductor chip includes a reverse face electrode bonded to the first lead.

APPENDIX 18

The semiconductor device according to any one of appendices 1 to 17, wherein the substrate reverse face is exposed from the sealing resin.

APPENDIX 19

The semiconductor device according to any one of appendices 1 to 18, wherein the substrate is formed of a ceramic.

REFERENCE SIGNS

A1, A2, A3, A4, A5, A6: semiconductor device
1, 11 to 15, 15a, 15b: lead
111: bonding portion
111a: obverse face
111b: reverse face
112: protruding portion
113: inclined portion
114: parallel portion
151: bonding portion
151a: obverse face
151b: reverse face
152: protruding portion
153: inclined portion
154: parallel portion
2: substrate
21: substrate obverse face
22: substrate reverse face 25, 251 to 253: bonding section
3: conductive section
31, 31a: first pad
32, 32a to 32k, 32m, 32n, 32p, 32q: second pad
33, 33a to 33k, 33m: connection wiring
4, 4a, 4b: semiconductor chip
41: element obverse face
42: element reverse face
43: source electrode
44: gate electrode
45: drain electrode
5, 5a, 5b: control device
53: lead
6: passive element
6a: shunt resistor
6b: thermistor
71: wire
72, 72a: wire
73, 73a to 73e: wire
75: bonding material
76: conductive bonding material
8: sealing resin
81: resin obverse face
82: resin reverse face
83: resin side face

The invention claimed is:

1. A semiconductor device comprising:
a substrate having a substrate obverse face and a substrate reverse face oriented in opposite directions to each other in a thickness direction;
a conductive section formed of a conductive material and located on the substrate obverse face, the conductive section including a first section and a second section spaced apart from each other;
a sealing resin covering at least a part of the substrate and an entirety of the conductive section; and
a conductive section wire conductively bonded to the first section and the second section,
wherein the conductive section includes a first wiring connected to the first section, and a third section connected to the first wiring.

2. The semiconductor device according to claim 1, wherein the conductive section includes a fourth section spaced apart from the first section and the second section, and
the conductive section wire overlaps with the fourth section, as viewed in the thickness direction.

3. The semiconductor device according to claim 1, further comprising electronic parts electrically connected to the conductive section, and arranged on the substrate obverse face,
wherein the conductive section wire overlaps with the electronic parts, as viewed in the thickness direction.

4. The semiconductor device according to claim 1, further comprising bonded electronic parts arranged on the substrate obverse face, wherein the bonded electronic parts are conductively bonded to the first section.

5. The semiconductor device according to claim 4, wherein the bonded electronic parts include a thermistor.

6. The semiconductor device according to claim 4, wherein the bonded electronic parts include a control device.

7. The semiconductor device according to claim 1, further comprising bonded electronic parts arranged on the substrate obverse face,
wherein the bonded electronic parts are conductively bonded to the third section.

8. The semiconductor device according to claim 1, wherein the substrate reverse face is exposed from the sealing resin.

9. The semiconductor device according to claim 1, wherein the substrate is formed of a ceramic.

10. A semiconductor device comprising:
a substrate having a substrate obverse face and a substrate reverse face oriented in opposite directions to each other in a thickness direction;
a conductive section formed of a conductive material and located on the substrate obverse face, the conductive section including a first section and a second section spaced apart from each other;
a sealing resin covering at least a part of the substrate and an entirety of the conductive section;
a conductive section wire conductively bonded to the first section and the second section;
a first lead arranged on the substrate obverse face, and higher in thermal conductivity than the substrate; and
a semiconductor chip located on the first lead.

11. The semiconductor device according to claim 10, further comprising a bonding section formed on the substrate obverse face, and including the conductive material constituting the conductive section,
wherein the first lead is bonded to the bonding section, via a bonding material.

12. The semiconductor device according to claim 10, wherein a part of the first lead is covered with the sealing resin, and another part is exposed from the sealing resin.

13. The semiconductor device according to claim 10, further comprising a second lead spaced apart from the first lead, and bonded to the conductive section via a conductive bonding material,
wherein a part of the second lead is covered with the sealing resin, and another part is exposed from the sealing resin.

14. The semiconductor device according to claim 13, wherein the second lead is conductively bonded to the second section.

15. The semiconductor device according to claim 13, wherein the conductive section further includes a second wiring connected to the second section, and a fifth section connected to the second wiring.

16. The semiconductor device according to claim 15, wherein the second lead is conductively bonded to the fifth section.

17. The semiconductor device according to claim 10, wherein the semiconductor chip is a power transistor.

18. The semiconductor device according to claim 10, wherein the semiconductor chip includes a reverse face electrode bonded to the first lead.

19. The semiconductor device according to claim 10, wherein the substrate reverse face is exposed from the sealing resin.

20. The semiconductor device according to claim 10, wherein the substrate is formed of a ceramic.

* * * * *